(12) United States Patent
Ekstrand et al.

(10) Patent No.: US 11,729,514 B2
(45) Date of Patent: *Aug. 15, 2023

(54) IMAGE PROCESSING METHOD AND APPARATUS

(71) Applicant: Huawei Technologies Co., Ltd., Shenzhen (CN)

(72) Inventors: Simon Ekstrand, Eslov (SE); Zhiming Fan, Shenzhen (CN); Fenglong Jin, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 125 days.

This patent is subject to a terminal disclaimer.

(21) Appl. No.: 17/246,294

(22) Filed: Apr. 30, 2021

(65) Prior Publication Data

US 2021/0258479 A1 Aug. 19, 2021

Related U.S. Application Data

(63) Continuation of application No. 16/278,738, filed on Feb. 19, 2019, now Pat. No. 11,039,064, which is a
(Continued)

(30) Foreign Application Priority Data

Aug. 19, 2016 (CN) .......................... 201610697684.4

(51) Int. Cl.
*H04N 23/80* (2023.01)
*G06T 5/00* (2006.01)
(Continued)

(52) U.S. Cl.
CPC ............. *H04N 23/80* (2023.01); *G06T 5/002* (2013.01); *G06T 11/00* (2013.01);
(Continued)

(58) Field of Classification Search
CPC .. H04N 5/341; H04N 5/2351; H04N 5/23229; H04N 5/35563; H04N 9/3129;
(Continued)

(56) References Cited

U.S. PATENT DOCUMENTS

| | | |
|---|---|---|
| 8,976,778 B2 | 3/2015 | Bedrosian |
| 2005/0147322 A1 | 7/2005 | Saed |

(Continued)

FOREIGN PATENT DOCUMENTS

| | | |
|---|---|---|
| CN | 101587586 A | 11/2009 |
| CN | 104157005 A | 11/2014 |

(Continued)

*Primary Examiner* — Daniel G Mariam
(74) *Attorney, Agent, or Firm* — Leydig, Voit & Mayer, Ltd.

(57) ABSTRACT

An image processing method and apparatus. The method includes: obtaining a source image; determining spot superposition positions according to pixel values of the source image, where values of pixels of the source image that are located in the spot superposition positions are greater than a preset first threshold; and blurring the source image, and performing, in the spot superposition positions of a source image, image fusion on the source image and spot images to obtain a processed image, where the spot superposition positions and the spot images fused with in the spot superposition positions are in a one-to-one correspondence.

20 Claims, 14 Drawing Sheets

Related U.S. Application Data continuation of application No. PCT/CN2017/079795, filed on Apr. 7, 2017.

(51) Int. Cl.
*G06T 11/00* (2006.01)
*H04N 25/40* (2023.01)
*H04N 25/585* (2023.01)
*H01L 27/148* (2006.01)

(52) U.S. Cl.
CPC ....... *H01L 27/14812* (2013.01); *H04N 25/40* (2023.01); *H04N 25/585* (2023.01)

(58) Field of Classification Search
CPC ...... H04N 23/80; H04N 25/40; H04N 25/585; G06T 5/002; G06T 2207/20221; G06T 11/00; H01L 27/14812
See application file for complete search history.

(56) References Cited

U.S. PATENT DOCUMENTS

| | | |
|---|---|---|
| 2009/0290796 A1 | 11/2009 | Shi et al. |
| 2013/0022289 A1 | 1/2013 | Umeda et al. |
| 2014/0368494 A1 | 12/2014 | Sakharnykh et al. |
| 2017/0063985 A1 | 3/2017 | Xun |
| 2018/0262287 A1 | 9/2018 | Han et al. |

FOREIGN PATENT DOCUMENTS

| | | |
|---|---|---|
| CN | 104463787 A | 3/2015 |
| CN | 104700371 A | 6/2015 |
| CN | 105404438 A | 3/2016 |
| CN | 105516586 A | 4/2016 |
| CN | 106504220 A | 3/2017 |
| JP | 2016130936 A | 7/2016 |

(a)          (b)

(a)

(b)

(a) (b)

(a)

(b)

(c)

(d)

(e)

(f)

IMAGE PROCESSING METHOD AND APPARATUS

CROSS-REFERENCE TO RELATED APPLICATIONS

This application is a continuation of U.S. patent application Ser. No. 16/278,738, filed on Feb. 19, 2019, which is a continuation of International Application No. PCT/CN2017/079795, filed on Apr. 7, 2017. The International Application claims priority to Chinese Patent Application No. 201610697684.4, filed on Aug. 19, 2016. All of the aforementioned patent applications are hereby incorporated by reference in their entireties.

TECHNICAL FIELD

The present disclosure relates to the field of image processing technologies, and in particular, to an image processing method and apparatus.

BACKGROUND

Image blurring is an important image processing method in the image processing field. Therefore, the image blurring method is applied in a highly extensive range of application fields. For example, when an application program folder is opened on a home screen of a mobile phone, programs in the folder covers a background layer of the mobile phone, and the background layer of the mobile phone displays special effects such as blurring or dimming.

However, in an existing image blurring method, for example, on a search function screen on a home screen in an iOS system, simple blurring processing is performed directly on a background image and icon. Details are shown in FIG. 1. After a desktop icon is blurred, discontinuous color blocks are formed, and a user cannot gain layered and more real visual experience. Alternatively, as shown in FIG. 2, in an Android system, when a folder is opened on a desktop, only a wallpaper is blurred, and experience is relatively monotonous.

SUMMARY

To resolve the foregoing technical problems, the present disclosure provides an image processing method and apparatus.

According to a first aspect, the present disclosure provides an image processing method, where the method includes: obtaining a source image; determining spot superposition positions according to pixel brightness values of the source image, where brightness values of pixels of the source image that are located in the spot superposition positions are greater than a preset first threshold; blurring the source image; and performing, in the spot superposition positions of a blurred image, image fusion on the blurred image and spot images to obtain a processed image, where the spot superposition positions and the spot images fused with in the spot superposition positions are in a one-to-one correspondence.

The spot superposition positions are determined according to the brightness values of the source image. After the source image is blurred, image fusion with the spot images is performed in the spot superposition positions of the blurred image, and an image obtained after the fusion is more real. Actually, the spots herein are stains that are displayed on the image and that can bring a beautifying effect, for example, triangular or heart-shaped stains.

With reference to the first aspect, in a first possible implementation of the first aspect, the determining spot superposition positions according to pixel brightness values of the source image includes:

dividing the source image into at least two areas; determining a mean value of pixel brightness values of each area according to the pixel brightness values of each of the at least two areas; using, as candidate spot superposition positions, pixel positions in an area in which a mean value of pixel brightness values is greater than the first threshold; and selecting, as the spot superposition positions, all or some of the candidate spot superposition positions according to a preset condition, where a brightness value of a pixel that is of the source image and is located in the candidate spot superposition positions is greater than the first threshold, and a quantity of candidate spot superposition positions is greater than or equal to a third threshold and less than or equal to a fourth threshold.

After the source image is divided into multiple areas, not all areas are used for displaying a spot image, and instead, some areas may be selected as the candidate spot superposition positions. In addition, the candidate spot superposition positions must be areas in which a mean value of pixel brightness values is greater than the first threshold. However, to more precisely determine the spot superposition positions, areas that meet the preset condition need to be selected as final spot superposition positions from candidate areas. Details are as follows: With reference to the first possible implementation of the first aspect, in a second possible implementation of the first aspect, the selecting, as the spot superposition positions, all or some of the candidate spot superposition positions according to a preset condition includes:

calculating weight values of bright spot pixels in pixels located in the candidate spot superposition positions, where the bright spot pixels are pixels whose brightness values are greater than the first threshold, and the weight value is used to indicate density of pixels whose brightness values are greater than the first threshold in an area in which the bright spot pixels are located; and using, as the spot superposition positions, positions of pixels whose weight values are greater than a preset second threshold in the bright spot pixels.

Not all pixel brightness values in the candidate spot superposition positions are greater than the first threshold, but merely a mean value is greater than the first threshold. Therefore, a pixel whose brightness value is greater than the first threshold needs to be selected from the candidate spot superposition positions, and a weight value of the pixel is calculated. When the weight value of the pixel is greater than the second threshold, a position of the pixel is determined as a precise superposition position for spot image.

In the second possible implementation of the first aspect in the present disclosure, although a spot superposition position has been precisely determined, whether a spot image is to be displayed in the position is not determined. To prevent spot images from being displayed too densely, in a third possible implementation of the first aspect in the present disclosure, a criterion about whether to display a spot image in two spot superposition positions is specified. Details are shown in the third possible implementation of the first aspect in the present disclosure.

With reference to any one of the first aspect to the second possible implementation of the first aspect, in the third possible implementation of the first aspect, the spot superposition positions are at least two positions, and the performing, in the spot superposition positions of a blurred image, image fusion on the blurred image and spot images includes:

determining whether an overlapping part exists between spot images to be fused with in two of the spot superposition positions; and when an overlapping part exists between the spot images to be fused with in the two positions, performing, in one of the two positions, image fusion on the blurred image and one of the spot images; or when no overlapping part exists between the spot images to be fused with in the two positions, separately performing, in the two positions, image fusion on the blurred image and one of the spot images; or calculating a distance between two of the spot superposition positions and a sum of sizes of spot images to be fused with in the two positions; and when the distance between the two positions is less than the sum of the sizes of the spot images to be fused with in the two positions, performing, in one of the two positions, image fusion on the blurred image and one of the spot images, where the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately performing, in the two positions, image fusion on the blurred image and one of the spot images.

With reference to any one of the first aspect to the third possible implementation of the first aspect, in a fourth possible implementation of the first aspect, before the performing, in the spot superposition positions of a blurred image, image fusion on the blurred image and spot images, the method further includes:

determining at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

Before the spot images and the blurred image are fused in the spot superposition positions, some parameters related to the spot images are first determined, so that the displayed spots can be closer to spots in a physical and real world and be more real.

With reference to the fourth possible implementation of the first aspect, in a fifth possible implementation of the first aspect, the method is performed by a terminal device; the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; and the determining sizes of the spot images fused with in the spot superposition positions includes:

calculating a first ratio of a length of a diagonal line of a prestored reference image to a length of a diagonal line of a screen of the terminal device, where the length of the diagonal line of the reference image and the length of the diagonal line of the screen of the terminal device are both expressed by a pixel quantity;

calculating a second ratio of a length of a diagonal line of the source image to the length of the diagonal line of the screen of the terminal device; and determining, according to a size of a spot image fused with the prestored reference image and a ratio of the first ratio to the second ratio, the sizes of the spot images fused with in the spot superposition positions.

With reference to the fifth possible implementation of the first aspect, in a sixth possible implementation of the first aspect, the determining, according to a size of a spot image fused with the prestored reference image and a ratio of the first ratio to the second ratio, the sizes of the spot images fused with in the spot superposition positions includes:

determining, according to the following formula, the sizes of the spot images fused with in the spot superposition positions:

$$a' = a \times \frac{r'}{r}$$

where a' is the sizes of the spot images fused with in the spot superposition positions, a is the size of the spot image fused with the prestored reference image, r is the first ratio, and r' is the second ratio.

With reference to any one of the fourth possible implementation of the first aspect to the sixth possible implementation of the first aspect, in a seventh possible implementation of the first aspect, the determining pixel colors of the spot images includes: using colors of pixels in the spot superposition positions of the blurred image as the pixel colors of the spot images fused with in the spot superposition positions.

The colors of the spots are determined by using a color of the blurred image, so that the spot images and the blurred image that has been blurred can be fused more thoroughly.

With reference to any one of the fourth possible implementation of the first aspect to the seventh possible implementation of the first aspect, in an eighth possible implementation of the first aspect, the shapes of the spot images fused with in the spot superposition positions include at least one of a circle, a heart shape, an irregular circle, a polygon, or a multi-angle shape.

There may include multiple application scenarios in which a spot image is fused with an image. In the following several specific implementations, several different application scenarios are enumerated in the present disclosure.

With reference to any one of the first aspect to the eighth possible implementation of the first aspect, in a ninth possible implementation of the first aspect, the method is performed by a terminal device, the source image is a wallpaper photo on an unlocked screen of the terminal device, and when the screen of the terminal device is searched for an application, the method further includes: displaying the source image on the unlocked screen, and displaying the processed image on the unlocked screen when a search bar of search software pops up on the unlocked screen of the terminal device.

It should be noted that the wallpaper photo herein is a wallpaper image displayed on the terminal screen after the terminal device is unlocked. The wallpaper photo may be an existing photo in a wallpaper library of the terminal device or a photo obtained from the terminal device by using another channel (such as a gallery).

With reference to any one of the first aspect to the eighth possible implementation of the first aspect, in a tenth possible implementation of the first aspect, the method is performed by a terminal device, the source image is an image on a lock screen of the terminal device, and the method further includes:

displaying the source image on the lock screen; and displaying the processed image on the lock screen when caller identification display is detected on the terminal device.

With reference to any one of the first aspect to the eighth possible implementation of the first aspect, in an eleventh possible implementation of the first aspect, the method is performed by a terminal device, the source image is an image on a lock screen of the terminal device, and the method further includes:

displaying the source image on the lock screen; and displaying the processed image on the lock screen when an unlocking operation is detected.

According to a second aspect, an embodiment of the present disclosure provides another image processing method, where the method includes:

obtaining a source image; determining spot superposition positions according to pixel brightness values of the source image, where brightness values of pixels of the source image that are located in the spot superposition positions are greater than a preset first threshold; and performing, in the spot superposition positions of the source image, fusion with spot images to obtain a processed image, where the spot superposition positions and the spot images fused with in the spot superposition positions are in a one-to-one correspondence.

The spot superposition positions are determined according to the brightness values of the source image. In the spot superposition positions, image fusion is performed on the source image and the spot images. An image obtained after the fusion is more real. Actually, the spots herein are stains that are displayed on the image and that can bring a beautifying effect, for example, triangular or heart-shaped stains. With reference to the second aspect, in a first possible implementation of the second aspect, the determining spot superposition positions according to pixel brightness values of the source image includes: dividing the source image into at least two areas; determining a mean value of pixel brightness values of each area according to the pixel brightness values of each of the at least two areas; and using, as candidate spot superposition positions, pixel positions in an area in which a mean value of pixel brightness values is greater than the first threshold; and selecting, as the spot superposition positions, all or some of the candidate spot superposition positions according to a preset condition, where a brightness value of a pixel that is of the source image and is located in the candidate spot superposition positions is greater than the first threshold, and a quantity of candidate spot superposition positions is greater than or equal to a third threshold and less than or equal to a fourth threshold.

After the source image is divided into multiple areas, not all areas are used for displaying a spot image, and instead, some areas may be selected as the candidate spot superposition positions. In addition, the candidate spot superposition positions must be areas in which a mean value of pixel brightness values is greater than the first threshold. However, to more precisely determine the spot superposition positions, areas that meet the preset condition need to be selected as final spot superposition positions from candidate areas. Details are as follows.

With reference to the first possible implementation of the second aspect, in a second possible implementation of the second aspect, the selecting, as the spot superposition positions, all or some of the candidate spot superposition positions according to a preset condition includes:

calculating weight values of bright spot pixels in pixels located in the candidate spot superposition positions, where the bright spot pixels are pixels whose brightness values are greater than the first threshold, and the weight value is used to indicate density of pixels whose brightness values are greater than the first threshold in an area in which the bright spot pixels are located; and using, as the spot superposition positions, positions of pixels whose weight values are greater than a preset second threshold in the bright spot pixels.

Not all pixel brightness values in the candidate spot superposition positions are greater than the first threshold, but merely a mean value is greater than the first threshold. Therefore, a pixel whose brightness value is greater than the first threshold needs to be selected from the candidate spot superposition positions, and a weight value of the pixel is calculated. When the weight value of the pixel is greater than the second threshold, a position of the pixel is determined as a precise spot superposition position.

In the second possible implementation of the second aspect in the present disclosure, although a spot superposition position has been precisely determined, whether a spot image is to be displayed in the position is not determined. To prevent spot images from being displayed too densely, in a third possible implementation of the second aspect in the present disclosure, a criterion about whether to display a spot image in two spot superposition positions is specified. Details are shown in the third possible implementation of the second aspect in the present disclosure.

With reference to any one of the second aspect to the second possible implementation of the second aspect, in the third possible implementation of the second aspect, the spot superposition positions are at least two positions, and the performing, in the spot superposition positions of the source image, fusion with spot images includes:

determining whether an overlapping part exists between spot images to be fused with in two of the spot superposition positions; and when an overlapping part exists between the spot images to be fused with in the two positions, performing, in one of the two positions, image fusion on the source image and one of the spot images; or when no overlapping part exists between the spot images to be fused with in the two positions, separately performing, in the two positions, image fusion on the source image and one of the spot images; or calculating a distance between two of the spot superposition positions and a sum of sizes of spot images to be fused with in the two positions; and when the distance between the two positions is less than the sum of the sizes of the spot images to be fused with in the two positions, performing, in one of the two positions, image fusion on the source image and one of the spot images, where the spots to be superimposed on in the two positions are in a shape of a circle or a regular polygon; when the spot images to be fused with in the two positions are in a shape of a circle, the sizes of the spots to be fused with in the two positions each are a radius of the spots to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately performing, in the two positions, image fusion on the source image and one of the spot images.

With reference to any one of the second aspect to the third possible implementation of the second aspect, in a fourth possible implementation of the second aspect, before the performing, in the spot superposition positions of the source image, image fusion with spot images, the method further includes:

determining at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

Before the spot images and the source image are fused in the spot superposition positions, some parameters related to the spot images are first determined, so that the displayed spot images can be closer to spots in a physical and real world and be more real.

With reference to the fourth possible implementation of the second aspect, in a fifth possible implementation of the second aspect, the method is performed by a terminal device; the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; and the determining sizes of the spot images fused with in the spot superposition positions includes: calculating a first ratio of a length of a diagonal line of a prestored reference image to a length of a diagonal line of a screen of the terminal device, where the length of the diagonal line of the reference image and the length of the diagonal line of the screen of the terminal device are both expressed by a pixel quantity; and calculating a second ratio of a length of a diagonal line of the source image to the length of the diagonal line of the screen of the terminal device; and determining, according to a size of a spot image fused with the prestored reference image and a ratio of the first ratio to the second ratio, the sizes of the spot images fused with in the spot superposition positions.

With reference to the fifth possible implementation of the second aspect, in a sixth possible implementation of the second aspect, the determining, according to a size of a spot image fused with the prestored reference image and a ratio of the first ratio to the second ratio, the sizes of the spot images fused with in the spot superposition positions includes:

determining, according to the following formula, the sizes of the spot images fused with in the spot superposition positions:

$$a' = a \times \frac{r'}{r}$$

where a' is the sizes of the spot images fused with in the spot superposition positions, a is the size of the spot image fused with the prestored reference image, r is the first ratio, and r' is the second ratio.

With reference to any one of the fourth possible implementation of the second aspect to the sixth possible implementation of the second aspect, in a seventh possible implementation of the second aspect, the determining pixel colors of the spot images includes:

using colors of pixels in the spot superposition positions of the source image as the pixel colors of the spot images fused with in the spot superposition positions.

The colors of the spots are determined by using a color of a blurred image, and therefore, the spot images and the source image can be fused more thoroughly.

With reference to any one of the fourth possible implementation of the second aspect to the seventh possible implementation of the second aspect, in an eighth possible implementation of the second aspect, the shapes of the spot images fused with in the spot superposition positions include at least one of a circle, a heart shape, an irregular circle, a polygon, or a multi-angle shape.

With reference to any one of the second aspect to the eighth possible implementation of the second aspect, in a ninth possible implementation of the second aspect, the method further includes:

when a change in the spot superposition positions is detected, determining, according to a brightness value of a pixel in a new spot superposition position of the source image, a size of a spot image fused with in the new spot superposition position and transparency of the spot image fused with in the new spot superposition position; and determining, according to a color of the pixel in the new spot superposition position of the source image, a color of the spot image fused with in the new spot superposition position.

Positions in which the spot images are displayed may be changed randomly according to a user preference. However, when the terminal device detects that a spot superposition position changes, a radius, a color, transparency, or the like of a spot image needs to be re-determined according to a parameter such as brightness, transparency, and a color in a new position that are of the source image.

According to a third aspect, an embodiment of the present disclosure further provides an image processing apparatus, where the apparatus includes:

an obtaining unit, configured to obtain a source image; and a processing unit, configured to: determine spot superposition positions according to pixel brightness values of the source image, where brightness values of pixels of the source image that are located in the spot superposition positions are greater than a preset first threshold; blur the source image; and perform, in the spot superposition positions of a blurred image, image fusion on the blurred image and spot images to obtain a processed image, where the spot superposition positions and the spot images fused with in the spot superposition positions are in a one-to-one correspondence.

The processing unit determines the spot superposition positions according to the brightness values of the source image that is obtained by the obtaining unit. After the source image is blurred, image fusion with the spot images is performed in the spot superposition positions of the blurred image, and an image obtained after the fusion is more real. Actually, the spots herein are stains that are displayed on the image and that can bring a beautifying effect, for example, triangular or heart-shaped stains.

With reference to the third aspect, in a first possible implementation of the third aspect, the processing unit is configured to:

divide the source image into at least two areas; determine a mean value of pixel brightness values of each area according to the pixel brightness values of each of the at least two areas; use, as candidate spot superposition positions, pixel positions in an area in which a mean value of pixel brightness values is greater than the first threshold; and select, as the spot superposition positions, all or some of the candidate spot superposition positions according to a preset condition, where a brightness value of a pixel that is of the source image and is located in the candidate spot superposition positions is greater than the first threshold, and a quantity of candidate spot superposition positions is greater than or equal to a third threshold and less than or equal to a fourth threshold.

After the processing unit divides the source image into multiple areas, not all areas are used for displaying a spot image, and instead, some areas may be selected as the candidate spot superposition positions. In addition, the candidate spot superposition positions must be areas in which a mean value of pixel brightness values is greater than the first threshold. However, to more precisely determine the spot superposition positions, areas that meet the preset condition need to be selected as final spot superposition positions from candidate areas. Details are as follows.

With reference to the first possible implementation of the third aspect, in a second possible implementation of the third aspect, the processing unit is configured to:

calculate weight values of bright spot pixels in pixels located in the candidate spot superposition positions, where the bright spot pixels are pixels whose brightness values are greater than the first threshold, and the weight value is used to indicate density of pixels whose brightness values are greater than the first threshold in an area in which the bright spot pixels are located; and use, as the spot superposition positions, positions of pixels whose weight values are greater than a preset second threshold in the bright spot pixels.

Not all pixel brightness values in the candidate spot superposition positions are greater than the first threshold, but merely a mean value is greater than the first threshold. Therefore, the processing unit needs to select a pixel whose brightness value is greater than the first threshold in the candidate spot superposition positions, and calculate a weight value of the pixel. When the weight value of the pixel is greater than the second threshold, a position of the pixel is determined as a precise spot superposition position.

In the second possible implementation of the third aspect in the present disclosure, although the processing unit has been precisely determined a spot superposition position, whether a spot image is to be displayed in the position is not determined. To prevent spot images from being displayed too densely, in a third possible implementation of the third aspect in the present disclosure, the processing unit is configured to specify a criterion about whether to display a spot image in two spot superposition positions. Details are shown in the third possible implementation of the third aspect in the present disclosure.

With reference to any one of the third aspect to the second possible implementation of the third aspect, in the third possible implementation of the third aspect, the processing unit is configured to:

determine whether an overlapping part exists between spot images to be fused with in two of the spot superposition positions; and when an overlapping part exists between the spot images to be fused with in the two positions, perform, in one of the two positions, image fusion on the blurred image and one of the spot images; or when no overlapping part exists between the spot images to be fused with in the two positions, separately perform, in the two positions, image fusion on the blurred image and one of the spot images; or calculate a distance between two of the spot superposition positions and a sum of sizes of spot images to be fused with in the two positions; and when the distance between the two positions is less than the sum of the sizes of the spot images to be fused with in the two positions, perform, in one of the two positions, image fusion on the blurred image and one of the spot images, where the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately perform, in the two positions, image fusion on the blurred image and one of the spot images.

With reference to any one of the third aspect to the third possible implementation of the third aspect, in a fourth possible implementation of the third aspect, the processing unit is further configured to determine at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

Before fusing, in the spot superposition positions, the spot images and the blurred image, the processing unit first determines some parameters related to the spot images, so that the displayed spot images can be closer to spots in a physical and real world and be more real.

With reference to the fourth possible implementation of the third aspect, in a fifth possible implementation of the third aspect, the processing unit is configured to:

calculate a first ratio of a length of a diagonal line of a prestored reference image to a length of a diagonal line of a screen of a terminal device, where the length of the diagonal line of the reference image and the length of the diagonal line of the screen of the terminal device are both expressed by a pixel quantity;

calculate a second ratio of a length of a diagonal line of the source image to the length of the diagonal line of the screen of the terminal device; and determine, according to a size of a spot image fused with the prestored reference image and a ratio of the first ratio to the second ratio, the sizes of the spot images fused with in the spot superposition positions.

With reference to the fifth possible implementation of the third aspect, in a sixth possible implementation of the third aspect, that the processing unit determines, according to a size of a spot image fused with the prestored reference image and a ratio of the first ratio to the second ratio, the sizes of the spot images fused with in the spot superposition positions includes:

determining, according to the following formula, the sizes of the spot images fused with in the spot superposition positions:

$$a' = a \times \frac{r'}{r}$$

where a' is the sizes of the spot images fused with in the spot superposition positions, a is the size of the spot image fused with the prestored reference image, r is the first ratio, and r' is the second ratio.

With reference to any one of the fourth possible implementation of the third aspect to the sixth possible implementation of the third aspect, in a seventh possible implementation of the third aspect, the processing unit is configured to:

use colors of pixels in the spot superposition positions of the blurred image as the pixel colors of the spot images fused with in the spot superposition positions.

The processing unit determines the colors of the spots by using a color of the blurred image, and so that the spot images and the blurred image that has been blurred can be fused more thoroughly.

With reference to any one of the fourth possible implementation of the third aspect to the seventh possible implementation of the third aspect, in an eighth possible implementation of the third aspect, the shapes of the spot images fused with in the spot superposition positions include at least one of a circle, a heart shape, an irregular circle, a polygon, or a multi-angle shape.

There may include multiple application scenarios in which a spot image is fused with an image. In the following several specific aspects, several different application scenarios are enumerated in the present disclosure.

With reference to any one of the third aspect to the eighth possible implementation of the third aspect, in a ninth possible implementation of the third aspect, the source image is a wallpaper photo on an unlocked screen of the terminal device, and when the screen of the terminal device is searched for an application, the apparatus further includes:

a display unit, configured to display the source image on the unlocked screen; and the display unit is further configured to display the processed image on the unlocked screen when a search bar of search software pops up on the unlocked screen of the terminal device.

It should be noted that the wallpaper photo herein is a wallpaper image displayed on the terminal screen after the terminal device is unlocked. The wallpaper photo may be an existing photo in a wallpaper library of the terminal device or a photo obtained from the terminal device by using another channel (such as a gallery).

With reference to any one of the third aspect to the eighth possible implementation of the third aspect, in a tenth possible implementation of the third aspect, the source image is an image on a lock screen of the terminal device, and the apparatus further includes:

a display unit, configured to display the source image on the lock screen; and the display unit is further configured to display the processed image on the lock screen when caller identification display is detected on the terminal device.

With reference to any one of the third aspect to the eighth possible implementation of the third aspect, in an eleventh possible implementation of the third aspect, the source image is an image on a lock screen of the terminal device, and the apparatus further includes:

a display unit, configured to display the source image on the lock screen; and the display unit is further configured to display the processed image on the lock screen when an unlocking operation is detected.

According to a fourth aspect, an embodiment of the present disclosure further provides another image processing apparatus, where the apparatus includes:

an obtaining unit, configured to obtain a source image; and a processing unit, configured to: determine spot superposition positions according to pixel brightness values of the source image that is obtained by the obtaining unit, where brightness values of pixels of the source image that are located in the spot superposition positions are greater than a preset first threshold; and perform, in the spot superposition positions of the source image, fusion with spot images to obtain a processed image, where the spot superposition positions and the spot images fused with in the spot superposition positions are in a one-to-one correspondence.

The processing unit determines the spot superposition positions according to the brightness values of the source image. In the spot superposition positions, image fusion is performed on the source image and the spot images. An image obtained after the fusion is more real. Actually, the spots herein are stains that are displayed on the image and that can bring a beautifying effect, for example, triangular or heart-shaped stains.

With reference to the fourth aspect, in a first possible implementation of the fourth aspect, the processing unit is configured to:

divide the source image into at least two areas; determine a mean value of pixel brightness values of each area according to the pixel brightness values of each of the at least two areas; and use, as candidate spot superposition positions, pixel positions in an area in which a mean value of pixel brightness values is greater than the first threshold; and select, as the spot superposition positions, all or some of the candidate spot superposition positions according to a preset condition, where a brightness value of a pixel that is of the source image and is located in the candidate spot superposition positions is greater than the first threshold, and a quantity of candidate spot superposition positions is greater than or equal to a third threshold and less than or equal to a fourth threshold.

After the processing unit divides the source image into multiple areas, not all areas are used for displaying a spot image, and instead, some areas may be selected as the candidate spot superposition positions. In addition, the candidate spot superposition positions must be areas in which a mean value of pixel brightness values is greater than the first threshold. However, to more precisely determine the spot superposition positions, areas that meet the preset condition need to be selected as final spot superposition positions from candidate areas.

With reference to the first possible implementation of the fourth aspect, in a second possible implementation of the fourth aspect, the processing unit is configured to: calculate weight values of bright spot pixels in pixels located in the candidate spot superposition positions, where the bright spot pixels are pixels whose brightness values are greater than the first threshold, and the weight value is used to indicate density of pixels whose brightness values are greater than the first threshold in an area in which the bright spot pixels are located; and use, as the spot superposition positions, positions of pixels whose weight values are greater than a preset second threshold in the bright spot pixels.

Not all pixel brightness values in the candidate spot superposition positions are greater than the first threshold, but merely a mean value is greater than the first threshold. Therefore, the processing unit needs to select a pixel whose brightness value is greater than the first threshold in the candidate spot superposition positions, and calculate a weight value of the pixel. When the weight value of the pixel is greater than the second threshold, a position of the pixel is determined as a precise spot superposition position.

In the second possible implementation of the fourth aspect in the present disclosure, although a spot superposition position has been precisely determined, whether a spot image is to be displayed in the position is not determined. To prevent spot images from being displayed too densely, in a third possible implementation of the fourth aspect in the present disclosure, a criterion about whether to display a spot image in two spot superposition positions is specified. Details are shown in the third possible implementation of the fourth aspect in the present disclosure.

With reference to any one of the fourth aspect to the second possible implementation of the fourth aspect, in the third possible implementation of the fourth aspect, the processing unit is configured to:

determine whether an overlapping part exists between spot images to be fused with in two of the spot superposition positions; and when an overlapping part exists between the spot images to be fused with in the two positions, perform, in one of the two positions, image fusion on the source image and one of the spot images; or when no overlapping part exists between the spot images to be fused with in the two positions, separately perform, in the two positions, image fusion on the source image and one of the spot images; or calculate a distance between two of the spot superposition positions and a sum of sizes of spot images to be fused with in the two positions; and when the distance between the two positions is less than the sum of the sizes of the spot images to be fused with in the two positions, perform, in one of the two positions, image fusion on the source image and one of the spot images, where the spots to be superimposed on in the two positions are in a shape of a circle or a regular polygon; when the spot images to be fused with in the two positions are in a shape of a circle, the sizes of the spots to be fused with in the two positions each are a radius of the spots to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately perform, in the two positions, image fusion on the source image and one of the spot images.

With reference to any one of the fourth aspect to the third possible implementation of the fourth aspect, in a fourth possible implementation of the fourth aspect, the processing unit is further configured to determine at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

Before the spot images and the source image are fused in the spot superposition positions, some parameters related to the spot images are first determined, so that the displayed spot images can be closer to spots in a physical and real world and be more real.

With reference to the fourth possible implementation of the fourth aspect, in a fifth possible implementation of the fourth aspect, the processing unit is configured to: calculate a first ratio of a length of a diagonal line of a prestored reference image to a length of a diagonal line of a screen of a terminal device, where the length of the diagonal line of the reference image and the length of the diagonal line of the screen of the terminal device are both expressed by a pixel quantity; and calculate a second ratio of a length of a diagonal line of the source image to the length of the diagonal line of the screen of the terminal device; and determine, according to a size of a spot image fused with the prestored reference image and a ratio of the first ratio to the second ratio, the sizes of the spot images fused with in the spot superposition positions.

With reference to the fifth possible implementation of the fourth aspect, in a sixth possible implementation of the fourth aspect, that the processing unit determines, according to a size of a spot image fused with the prestored reference image and a ratio of the first ratio to the second ratio, the sizes of the spot images fused with in the spot superposition positions includes:

determining, according to the following formula, the sizes of the spot images fused with in the spot superposition positions:

$$a' = a \times \frac{r'}{r}$$

where a' is the sizes of the spot images fused with in the spot superposition positions, a is the size of the spot image fused with the prestored reference image, r is the first ratio, and r' is the second ratio.

With reference to any one of the fourth possible implementation of the fourth aspect to the sixth possible implementation of the fourth aspect, in a seventh possible implementation of the fourth aspect, the processing unit is configured to:

use colors of pixels in the spot superposition positions of the source image as the pixel colors of the spot images fused with in the spot superposition positions.

The colors of the spots are determined by using a color of a blurred image, so that the spots and the image can be fused more thoroughly.

With reference to any one of the fourth possible implementation of the fourth aspect to the seventh possible implementation of the fourth aspect, in an eighth possible implementation of the fourth aspect, the shapes of the spot images fused with in the spot superposition positions include at least one of a circle, a heart shape, an irregular circle, a polygon, or a multi-angle shape.

With reference to any one of the fourth aspect to the eighth possible implementation of the fourth aspect, in a ninth possible implementation of the fourth aspect, the apparatus further includes a detection unit, configured to detect whether the spot superposition positions change; and the processing unit is further configured to: when a change in the spot superposition positions is detected, determine, according to a brightness value of a pixel in a new spot superposition position of the source image, a size of a spot image fused with in the new spot superposition position, and transparency of the spot image fused with in the new spot superposition position; and determine, according to a color of the pixel in the new spot superposition position of the source image, a color of the spot image fused with in the new spot superposition position.

Positions in which the spot images are displayed may be changed randomly according to a user preference. However, when the terminal device detects that a spot superposition position changes, a radius, a color, transparency, or the like of a spot image needs to be re-determined according to a parameter such as brightness, transparency, and a color in a new position that are of the source image.

Embodiments of the present disclosure provide an image processing method. The spot image fused with the blurred image is jointly determined according to the color of the blurred image that has been blurred and the shape, the material effect, and the like of the spot image, and the size of the spot image is also closely related to the length of the diagonal line of the image and a length of a diagonal line of a screen of a terminal device. Therefore, a designed spot image is closer to a spot image in a physical and real world and is more real. The source image may be an image in any form, and is no longer monotonous, so that a user's visual experience is enriched.

DESCRIPTION OF EMBODIMENTS

The technical solutions in the embodiments of the present disclosure are further described in detail in the following with reference to accompanying drawings and embodiments.

To make the objectives, technical solutions, and advantages of the embodiments of the present disclosure clearer, the following clearly describes the technical solutions in the embodiments of the present disclosure with reference to the accompanying drawings in the embodiments of the present disclosure.

The present disclosure involves a terminal device. The terminal device may be a mobile phone, a computer, an iPad, or the like. A difference is that corresponding application scenarios applicable to the present disclosure vary according to different terminal devices. In the following, several different application scenarios and image processing methods and steps are described in detail.

Figure 1:
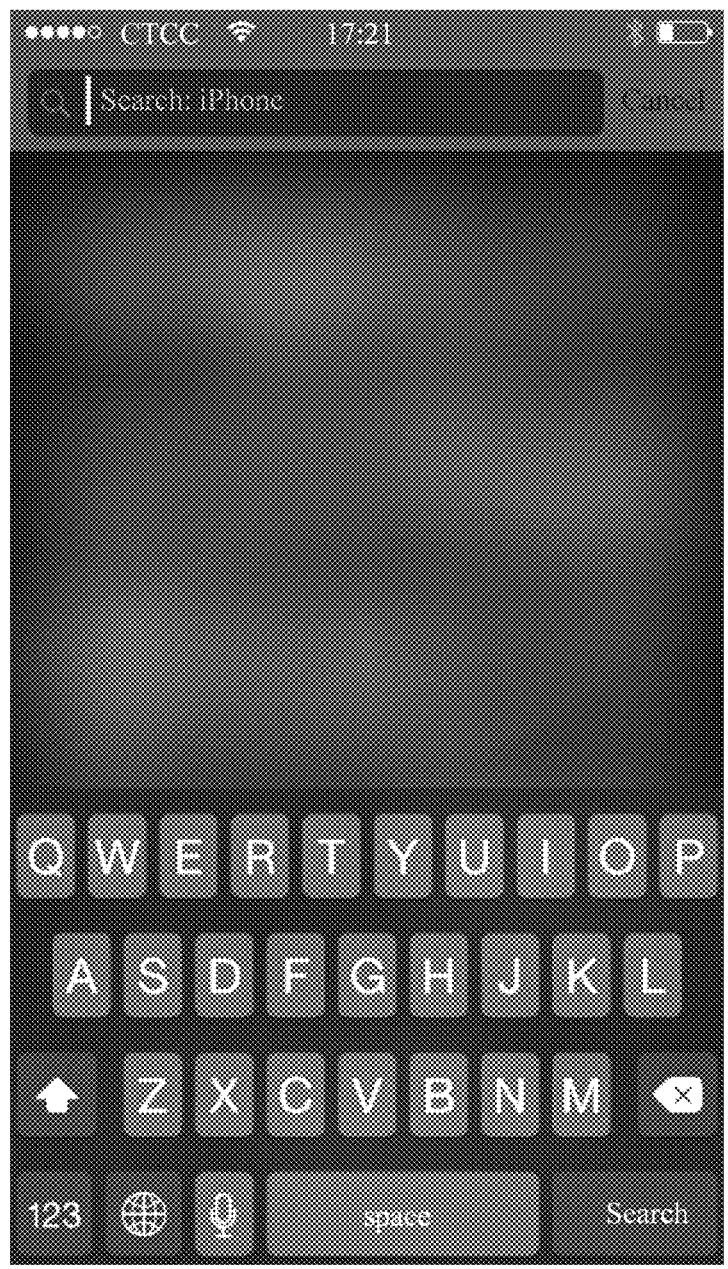
FIG. 1 is a schematic diagram of a blurred image obtained after a wallpaper on a home screen in an iOS system is blurred in the prior art.
Figure 2:
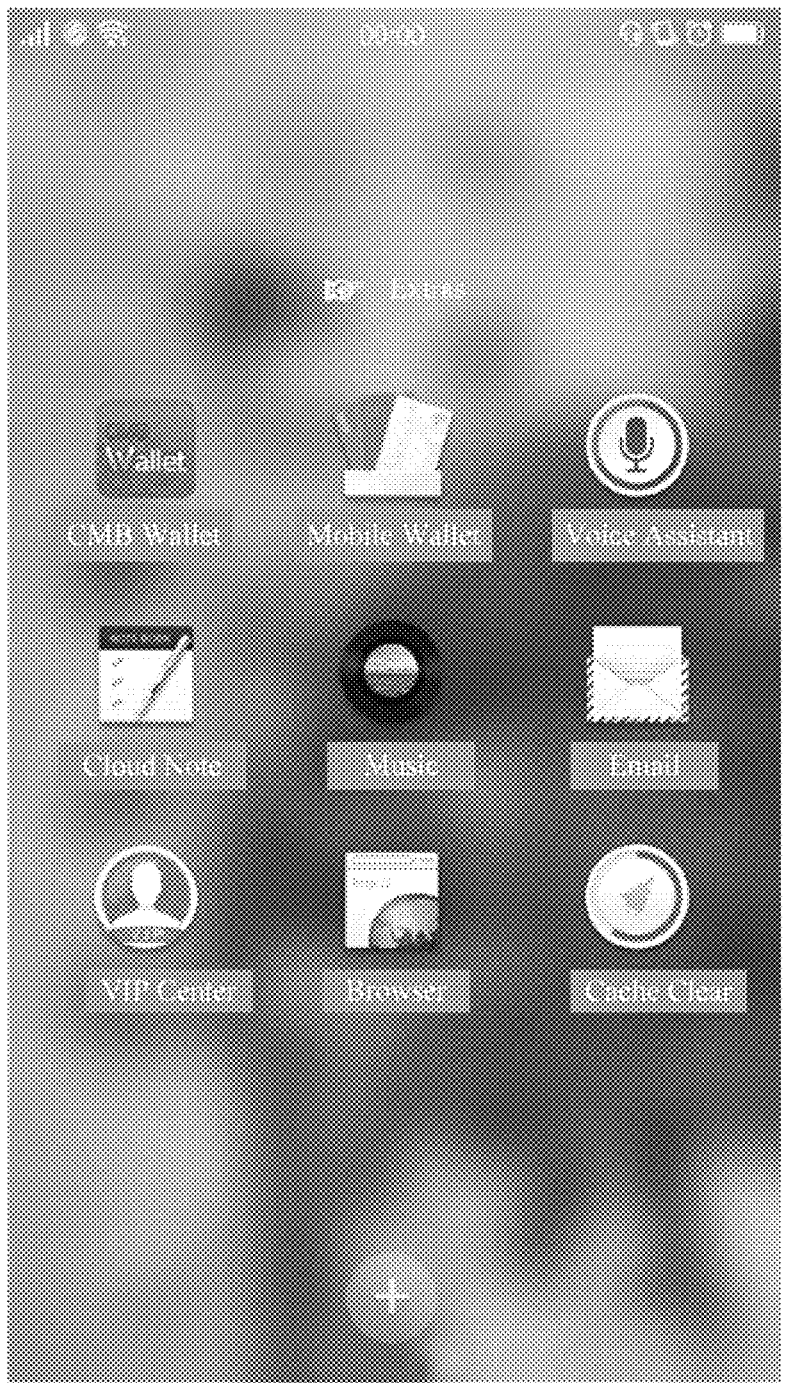
FIG. 2 is a schematic diagram of a blurred image obtained after a wallpaper on a home screen in an Android system is blurred in the prior art.
Figure 3:
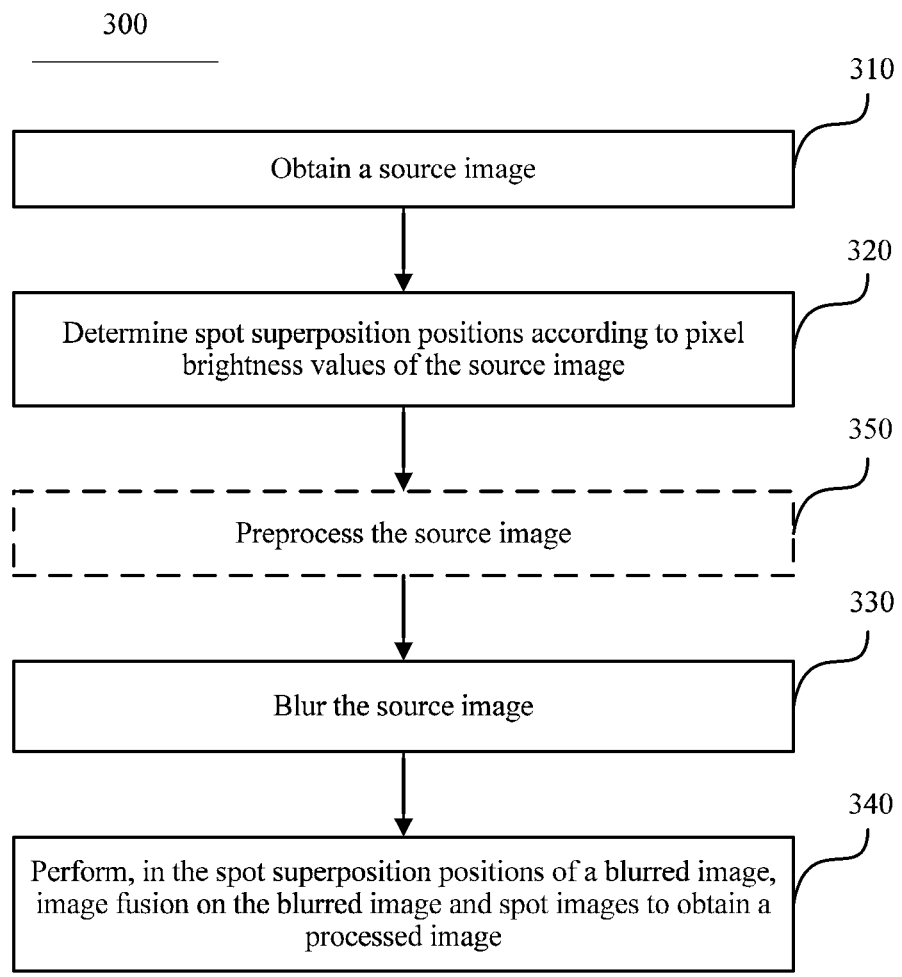
FIG. 3 is a schematic flowchart of an image processing method according to Embodiment 1 of the present disclosure.

FIG. 3 is a schematic flowchart 300 of an image processing method according to Embodiment 1 of the present disclosure. Details are shown in FIG. 3. The method includes the following steps.

Step 310: Obtain a source image.

The source image may include a background image on a display screen of a terminal device, for example, may be a desktop wallpaper or a lock screen wallpaper, or may be a music album cover or a large quantity of photos stored in the terminal device. The terminal device obtains the corresponding source image according to a related program.

Step 320: Determine spot superposition positions according to pixel brightness values of the source image.

A spot image described herein is actually a stain that is displayed on a blurred image and that can bring a beautifying effect, for example, a triangular or heart-shaped stain. A spot effect is mainly generated in a highlight area of an image. Before a spot image is determined, black and white processing needs to be first performed on a color image. In this way, a black-white contrast ratio of the image is increased, and the highlight area of the image is generated.

The determining spot superposition positions may include:

First, the source image on which black and white processing has been performed is divided into at least two areas in a preset manner.

Figure 4:
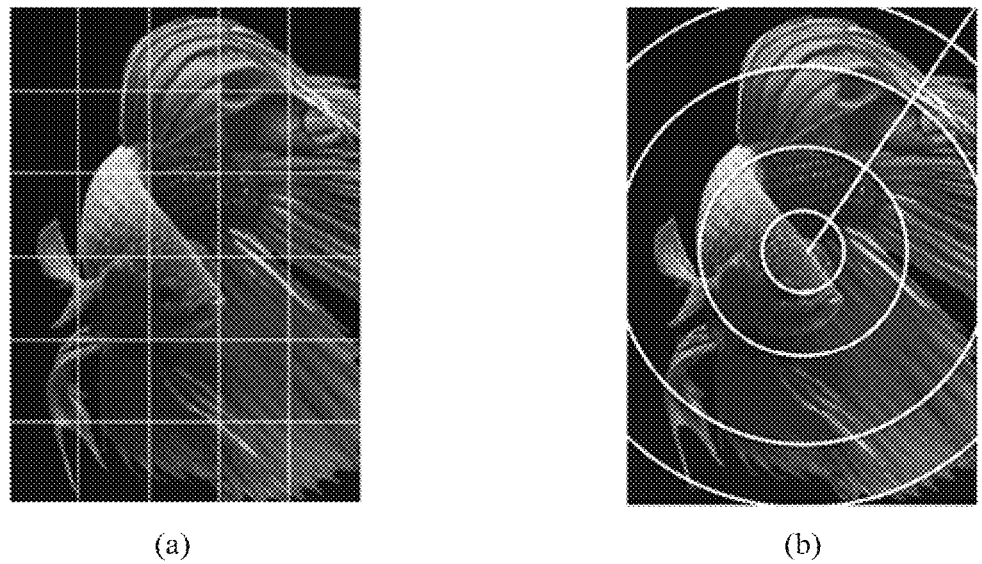
FIG. 4 is a schematic diagram in which a source image is divided into at least two areas in a preset manner.

A specific preset manner may be any manner, for example, by means of grid sampling or radar sampling. As shown in FIG. 4, FIG. 4 is a schematic diagram in which the source image is divided into at least two areas in the preset manner. FIG. 4 (a) is a schematic diagram in which the source image is divided into at least two areas in a grid sampling manner, and FIG. 4 (b) is a schematic diagram in which the source image is divided into at least two areas in a radar sampling manner. A smaller step indicates more precise sampling, but more sampling time is also required. Therefore, the terminal device may dynamically select a sampling step according to an actual requirement and a hardware condition or an idle state of a current system resource.

In the present disclosure, sampling is mainly performed in a grid form, and a sampling step is "15×15 px (px: pixel)". For example, after division is performed by using a step of "15×15 px" grids, an image with a resolution of 180×1920 px is divided into 9216 grids, that is, divided into 9216 areas.

Then, pixel brightness values of each of the at least two areas are sampled to obtain a mean value of the pixel brightness values of each area. Certainly, herein, other parameters including colors and saturation of pixels in each area may be further sampled, and a corresponding mean value is obtained, so as to prepare for subsequent determining of a color of a spot image or another operation. First, pixel positions in an area in which a mean value of pixel brightness values is greater than a first threshold are used as candidate spot superposition positions. Then, all or some of the candidate spot superposition positions are selected as the spot superposition positions according to a preset condition. A brightness value of a pixel that is of the source image and is located in the candidate spot superposition positions is greater than the first threshold. A total quantity of spot superposition positions is greater than a third threshold and less than a fourth threshold.

There may include the following two methods for selecting some or all spot superposition positions from the candidate spot superposition positions according to the preset condition, so as to more precisely determine the spot superposition positions.

In a first method, a specific position for fusing with a spot image is randomly selected from a highlight area determined for fusing with a spot image.

Figure 5:
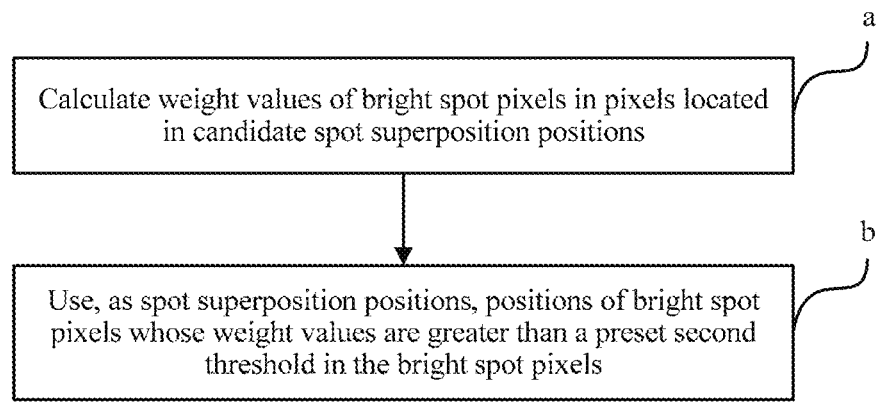
FIG. 5 is a schematic flowchart of a method for precisely determining a spot superposition position.

To more precisely determine the spot superposition positions, a second method may be used. The second method may include step a and step b. As shown in FIG. 5, step a is calculating weight values of bright spot pixels in pixels located in the candidate spot superposition positions.

Highlight areas, that is, areas in which a mean value of pixel brightness values is greater than the first threshold have been determined in the above. However, not all pixel brightness values in these areas are greater than the first threshold. Therefore, pixels whose brightness values are greater than the first threshold in the area need to be first determined as bright spot pixels. Then, weight values of the bright spot pixel are obtained. The weight value is used to indicate distribution density of the bright spot pixels. A specific weight value calculation method is described in detail in the following.

Step b: Use, as the spot superposition positions, positions of pixels whose weight values are greater than a preset second threshold in the bright spot pixels.

For example, bright spots of the source image that are in the spot superposition positions and have a density value greater than 10 in a sorting sequence are determined. That is, for example, in step b, 500 highlight areas are determined, and 50 areas are selected as spot superposition positions. Certainly, it is only roughly determined that there are 50 spot superposition positions. That is, candidate spot superposition positions are determined. However, in this step, to more precisely determine the spot superposition positions, bright spot pixels whose brightness values are greater than the first threshold in the 50 highlight areas need to be calculated, density weight values of these bright spot pixels are calculated, and positions of bright spot pixels whose weight values are greater than the second threshold are used as precise spot superposition positions.

However, it should be further noted that when a roughly-determined total quantity of spot superposition positions that meet a condition is less than a third preset threshold (for example, a quantity of spot images is less than 3), it indicates that the image is too dark and is not fused with a spot image. Alternatively, when a roughly-determined total quantity of highlight areas that meet a condition is greater than a fourth preset threshold (for example, the fourth threshold is as follows: after the image is divided into areas, a quantity of highlight areas that meet the condition account for 75% of a total area quantity), it indicates that the image is too bright and is also no longer fused with a spot image.

After it is determined that a position that meets a condition for fusing with a spot image, whether a spot image is to be fused with in the position needs to be further determined.

Whether an overlapping part exists between spot images to be fused with in two of the spot superposition positions may be determined. When an overlapping part exists between the spot images to be fused with in the two positions, image fusion is performed, in one of the two positions, on the blurred image and one of the spot images. When no overlapping part exists between the spot images to be fused with in the two positions, image fusion is separately performed, in the two positions, on the blurred image and one of the spot images.

Alternatively, a distance between two of the spot superposition positions and a sum of sizes of spot images to be fused with in the two positions are calculated. When the distance between the two positions is less than the sum of the sizes of the spot images to be fused with in the two positions, image fusion is performed, in one of the two positions, on the blurred image and one of the spot images. The spot images to be fused with in the two positions are in a shape of a circle or a regular polygon. When the spot images to be fused with in the two positions are in a shape of a circle, the sizes of the spot images to be fused with in the two positions each are a radius of the spot images to be fused with in the two positions; when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions.

When the distance between the two positions is greater than or equal to the sum of the sizes of the spot images to be fused with in the two positions, image fusion is separately performed, in the two positions, on the blurred image and one of the spot images. In the present disclosure, the sum of the spot image sizes of the spot images fused with in the two spot superposition positions is used as a reference. When the distance between the two spot superposition positions is less than the sum of the sizes of the spot images to be fused with in the two positions, one of the spot superposition positions is selected for fusing with a spot image, and 1 is added to a weight value of a bright spot pixel, of the blurred image, in a position in which the spot image is located, so that the spot image superimposed on in the spot position becomes larger and brighter. However, the other spot superposition position is ignored, that is, a spot image is no longer fused with in the position. When the distance between the two spot superposition positions is greater than the sum of the sizes of the two spot images to be fused with, the spot images are fused with in both of the two positions. This algorithm is intended to avoid a problem that a fusion effect is poor because spot images overlap with each other when spot superposition positions are concentrated. A process of determining the weight values of the bright spot pixels is the foregoing method for determining whether the distance between the two positions is greater than the sum of the sizes of the spot images to be fused with in the two positions and when the distance between the two spot superposition positions is less than the sum of the sizes of the spot images, determining to add 1 to a weight value of a bright spot pixel, of the blurred image, in a position in which a spot image is located. Similarly, when the two spot superposition positions do not overlap, the spot images are fused with in both of the two spot superposition positions. When an overlapping part exists between the two spot superposition positions, one of the spot superposition positions is selected for fusing with a spot image, and it is determined to add 1 to a weight value of a bright spot pixel, of the blurred image, in a position in which the spot image is located.

In addition, in the foregoing method, after the spot superposition positions are determined, determined area positions that can be used as the spot superposition positions also need to be recorded. For example, rows and columns in which the spot superposition positions are located relative to an origin position of the image are recorded. In addition, color information or the like of the source image in the positions also needs to be recorded.

Step 330: Blur the source image.

Figure 6:
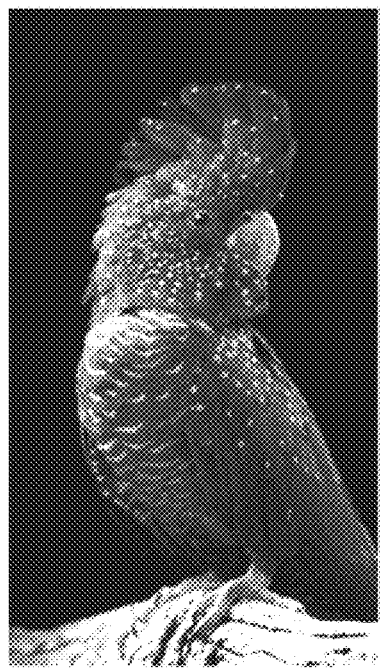
FIG. 6 is a diagram of a comparison between an image that has not been blurred and an image that has been blurred.
Figure 6:
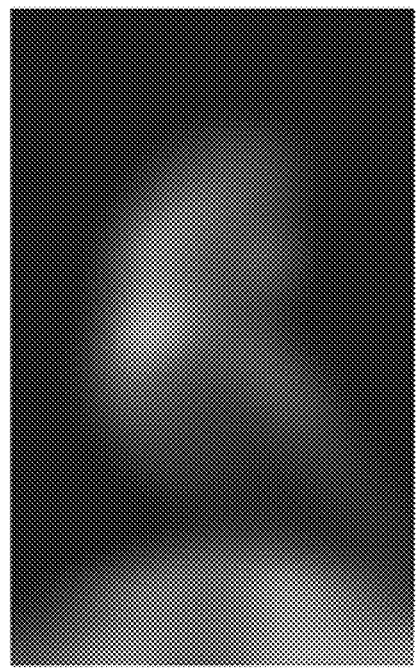

A manner for blurring the source image may include a blur algorithm such as Gaussian blur, fast blur, or stack blur. Preferably, in the present disclosure, the stack blur algorithm is used. For example, a blur degree that is a parameter in the blur algorithm is set to 80. FIG. 6 shows a specific source image and a blurred image. FIG. 6 is a diagram of a comparison between an image that has not been blurred and an image that has been blurred. FIG. 6 (a) is the source image, and FIG. 8 (b) is the blurred image. The blurred image may be stored in a memory of the terminal device, and may also be displayed on a screen of the terminal device at the same time. Certainly, a display time is extremely short. Alternatively, the blurred image is not displayed, but is stored in the memory of the terminal device, to prepare for subsequent use.

Preferably, before step 330, the method may further include step 350 in which the source image is preprocessed.

The source image is scaled down or scaled up to a preset value. For example, the source image is scaled down by 85%. Then, the image is blurred. Herein, a purpose of scaling down or scaling up the source image to a preset value is to make a motion form of the source image consistent with that of another element on the screen.

Step 340: Perform, in the spot superposition positions of a blurred image, image fusion on the blurred image and spot images to obtain a processed image.

In spot superposition areas, the blurred image is fused with the spot images, and the spot superposition positions and the spot images fused with in the spot superposition positions are in a one-to-one correspondence. That is, a non-spot superposition area of the blurred image maintains unchanged. The spot superposition areas are areas that can fully overlap with the spot images and in which the spot superposition positions are located.

Herein, it should be noted that there are multiple spot fusion algorithms, and the present disclosure constitutes no limitation on a method that is necessarily to be used. To better describe an implementation solution of the present disclosure, only one hybrid superimposition method is enumerated. A specific process of fusing, in the spot superposition areas, the spot images with the blurred image in the hybrid superimposition manner is as follows.

It is assumed that attributes (including a color and transparency) of pixels in the spot superposition areas of the blurred image may be expressed by using a quaternionic vector: bgColor=vec4(r,g,b,a). An attribute of each pixel in a material of a spot image is also expressed by using a quaternionic vector: flare=vec4(fr,fg,fb,fa), and, hybrid factors are ($\alpha$, $\beta$). An attribute of a pixel of the processed image obtained after image fusion is performed, in the spot superposition positions of the blurred image, on the blurred image and the spot images is:

$$perPixel=bgColor\times\alpha+flare\times\beta=var4(r\times\alpha+fr\times\beta,g\times\alpha+fg\times\beta,h\times\alpha+fh\times\beta,a\times\alpha+fa\times\beta)$$

The hybrid factors $\alpha$, $\beta$ are both numbers greater than or equal to 0 and less than or equal to 1. Certainly, an effect obtained after the image fusion varies with different selected hybrid factors.

In addition, before the performing, in the spot superposition positions of a blurred image, image fusion on the blurred image and spot images, the method may further include: determining at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

Materials of the spot images may have textures, for example, have randomly distributed noises similar to dust, water, scratches, or smudges. Certainly, the textures may be in another form, and this is not limited herein.

Figure 7:
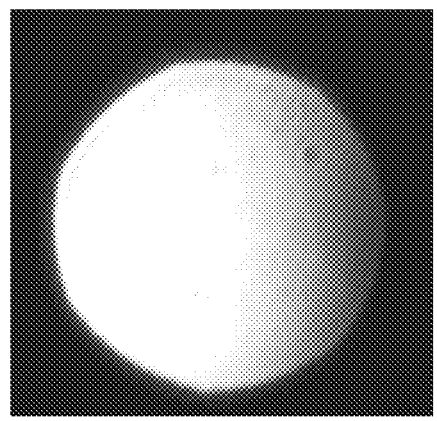
FIG. 7 is a schematic material diagram of a spot image on which noises are randomly distributed.

FIG. 7 is a schematic material diagram of a spot image on which noises are randomly distributed according to the present disclosure.

The shapes of the spot images fused with in the spot superposition positions may include at least one of a circle, a heart shape, an irregular circle, a polygon, a multi-angle shape, or an incomplete circle. Similarly, the shapes of the spot images may also be in another form, and this is not limited herein.

Figure 8:
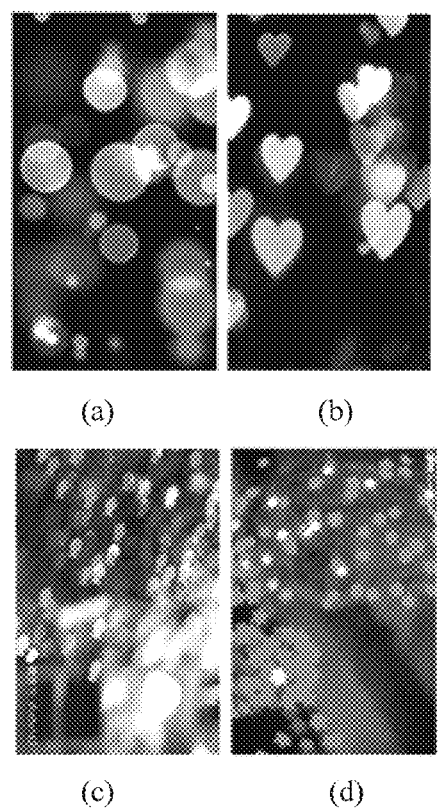
FIG. 8 shows several examples of a shape of a spot image according to the present disclosure.

FIG. 8 shows several examples of a shape of a spot image according to the present disclosure.

In this application document, the terminal device may determine the sizes of the spot images. The spot images to be fused with in the two positions are in a shape of a circle or a regular polygon. When the spot images to be fused with in the two positions are in a shape of a circle, the sizes of the spot images to be fused with in the two positions each are a radius of the spot images to be fused with in the two positions; when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions. On the basis of this, a specific process of calculating the sizes of the spot images is as follows.

First, a size a of a spot image fused with a prestored reference image may be set according to a designer's experience and stored in the memory of the terminal device.

Then, a first ratio r of a length b of a diagonal line of the prestored reference image to a length c of a diagonal line of a screen of the terminal device is calculated, and a second ratio r' of a length b' of a diagonal line of the source image to the length c' of the diagonal line of the screen of the terminal device is calculated. Finally, the sizes of the spot images fused with in the spot superposition positions are determined according to the size a of the spot image fused with the prestored reference image and a ratio of the first ratio r to the second ratio r. The length of the diagonal line of the reference image and the length of the diagonal line of the screen of the terminal device are both expressed by a pixel quantity. It is assumed that a resolution of the screen of the terminal device is 1080×1920. A figure formed by 1080×1920 pixels may be deemed as a rectangle. A length of a diagonal line of the rectangle is approximate to the length of the diagonal line of the screen of the terminal device.

A specific calculation of the sizes of the spot images fused with in the spot superposition positions may be expressed by the following formula:

$$a' = a \times \frac{r'}{r} \qquad (3-1)$$

where a' is the sizes of the spot images fused with in the spot superposition positions, a is the size of the spot image fused with the specified reference image, r is the first ratio, and r' is the second ratio.

Optionally, to reflect a more real spot image, the sizes of the spot images may be associated with screen density. For example, when the screen density is relatively low, the spot image is scaled down, and when the screen density is relatively high, the spot image is scaled up.

In addition, it can be learned from the foregoing that the sizes of the spot images may also be related to positions in which the spot images are fused with.

The determining colors of the spot images may include:

using colors of pixels in the spot superposition positions of the blurred image as the pixel colors of the spot images fused with in the spot superposition positions; or combining material effects of the spots and colors of pixels in the spot superposition positions in which the spot images are located, to determine the colors of the spot images. There may include multiple methods for determining the colors of the spot images. Preferably, two specific implementations are enumerated as examples for description in this embodiment. Another manner is not limited herein.

In a first specific manner, a color that is of the blurred image and is in the positions in which the spot images are located is fused with a color of an area in which the transparency of the spot images is not zero.

In a specific example, the color that is of the blurred image and is in the positions in which the spot images are located is fused with the colors of the spot images. In addition, the transparency of the spot images is adjusted, and then the spot images are displayed on the blurred image.

In a second specific manner, the textures of the spot images are padded, by using material shapes, with pixel colors in the positions in which the spot images are located.

Similar to the first manner, to determine the colors of the spot images, it is required to fuse texture colors of the spot images with the color that is of the blurred image and is in the positions in which the spot images are located. In addition, the transparency of the spot images is adjusted to determine final colors of the spot images.

Certainly, these two specific implementations are merely examples, and there may be other manners. This is not limited herein. For example, other processing such as color filtering, light softening, or division may be performed between the colors of the spot images and the color of the blurred image, to finally determine the colors of the spot images.

The transparency of the spot images is determined.

A brightness value reference a is first set, and after mean values P of pixel brightness values are sampled, P and a are compared. If P is greater than a, pixel brightness values are reduced to obtain the transparency of the spot images. The transparency of each spot image is preferably 5% to 75%. Preferably, in this embodiment, the transparency of the spot images is set to 75%.

A reader should understand that the steps of determining the material effects, the shapes, the sizes, and the colors of the spot images and the transparency of the spot images may be completed after step 320 or may be completed after step 330. This is not limited herein.

The foregoing methods in the present disclosure are all performed by a terminal device. Specific application scenarios may include multiple cases. In the following, three cases are enumerated as examples.

In a case, if the source image is a wallpaper photo on an unlocked screen of the terminal device, and when the screen of the terminal device is searched for an application, the method may further include:

displaying the source image on the unlocked screen; and displaying the processed image on the unlocked screen when a search bar of search software pops up on the unlocked screen of the terminal device. The screen wallpaper photo herein is a wallpaper image displayed on the terminal screen after the terminal device is unlocked. The wallpaper photo may be an existing photo in a wallpaper library of the terminal device or a photo obtained from the terminal device by using another channel (such as a gallery).

In another case, the source image is an image on a lock screen of the terminal device, and the method further includes:

displaying the source image on the lock screen, and displaying the processed image on the lock screen when caller identification display is detected on the terminal device.

In another case, the source image is an image on a lock screen of the terminal device, and the method further includes:

displaying the source image on the lock screen, and displaying the processed image on the lock screen when an unlocking operation is detected.

Figure 9:
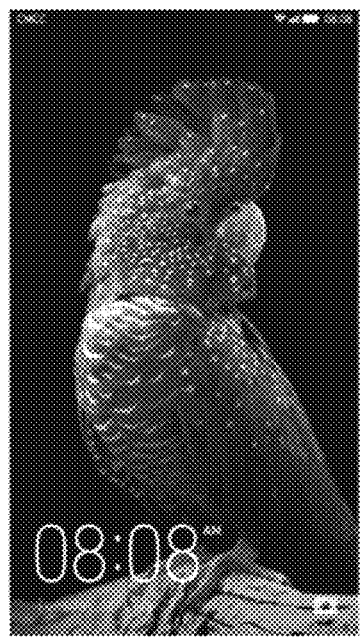
FIG. 9 shows a change process of a screen saver pattern and a spot image on the screen saver pattern when caller identification display occurs in a lock screen state.
Figure 9:
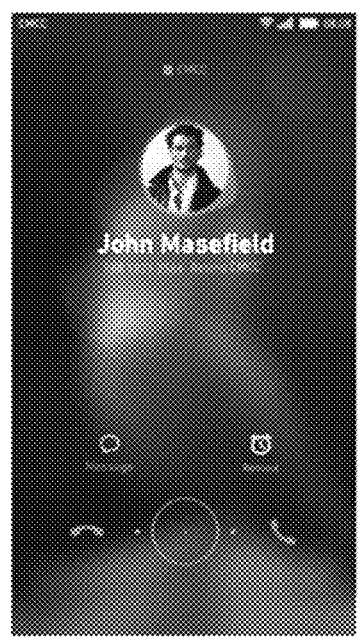

In a specific example, for example, when an application scenario is that the terminal device is in a lock screen state, before caller identification display occurs, a screen saver pattern of the terminal device is a bird shown in FIG. 9 (*a*). When caller identification display occurs, the screen saver of the terminal device becomes blurred, and spot images of different sizes are displayed in different areas of the blurred image. Except the step of determining the colors and the transparency of the spot images, other steps in the foregoing steps are all completed within a preset period of time. Therefore, a user sees a moving picture. That is, the spot images are displayed on a blurred screen saver pattern displayed in FIG. 9 (*b*), and an incoming call is displayed.

In another specific example, for example, an application scenario is sliding to unlock.

Figure 10:
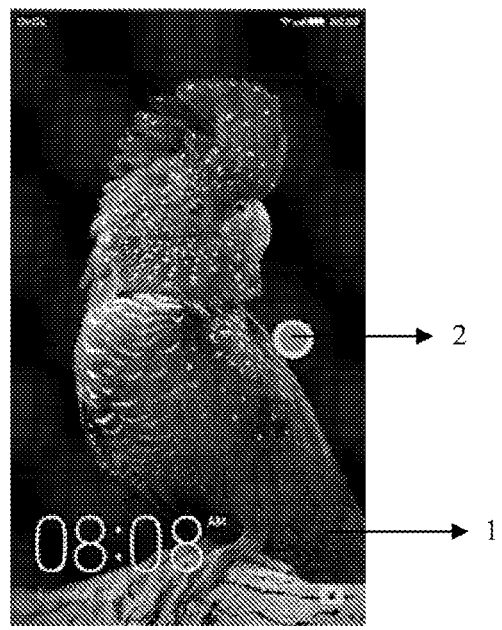
FIG. 10 shows a change process of an unlock pattern and a spot image on the unlock pattern when a screen of a terminal device transitions from the unlock pattern to a home screen.
Figure 10:
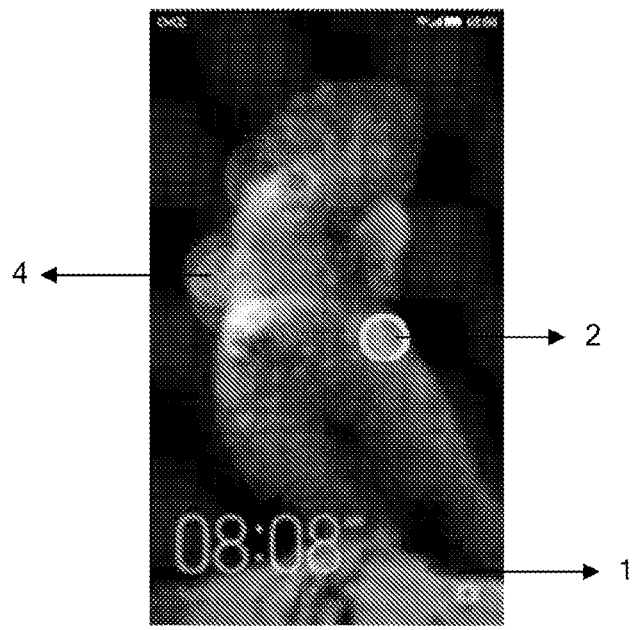
Figure 10:
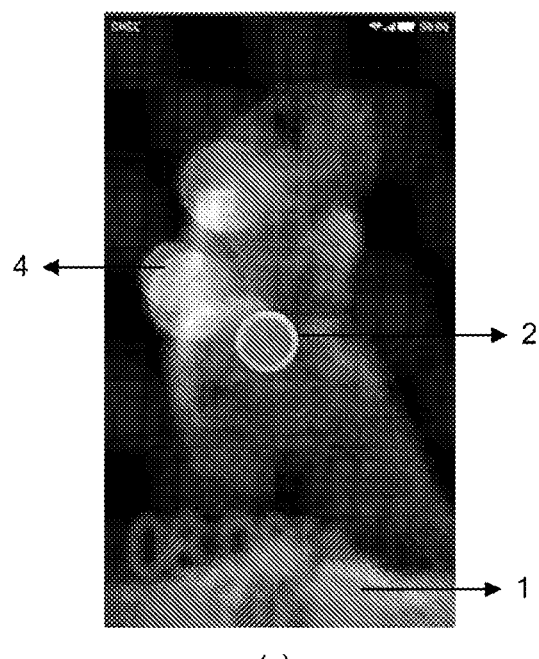
Figure 10:
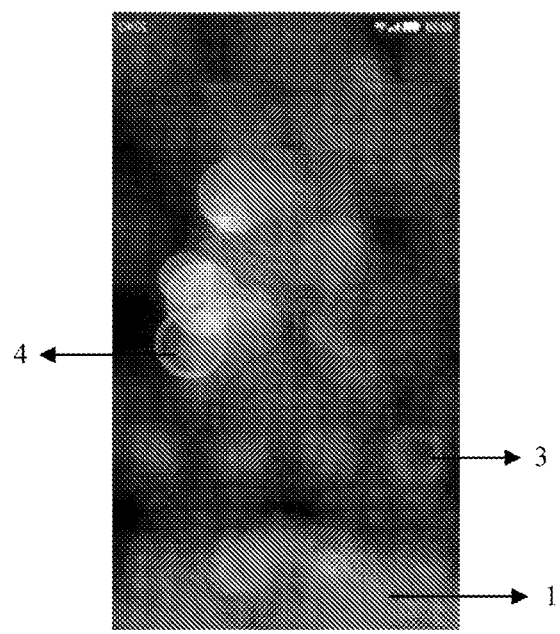
Figure 10:
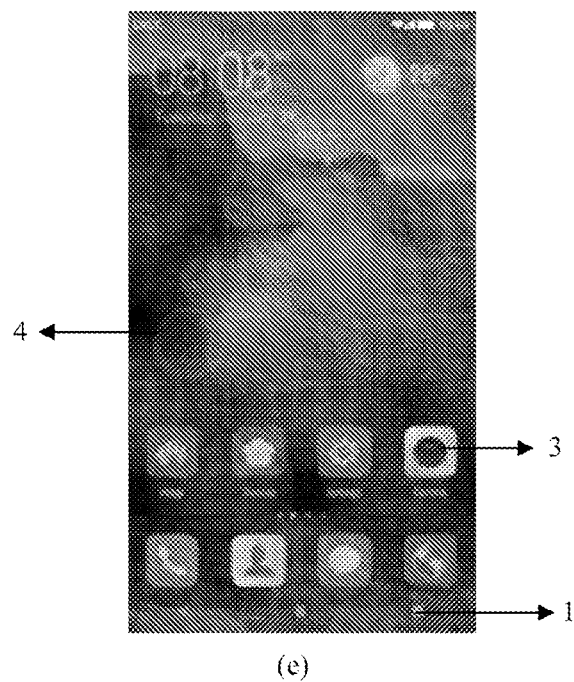
Figure 10:
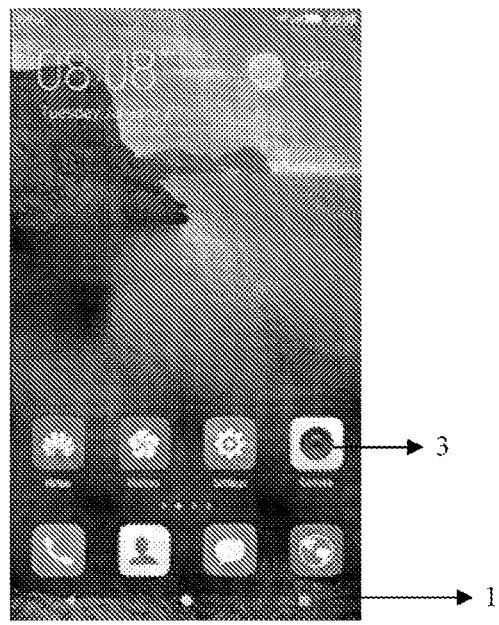

First, before step 320, the method further includes:

receiving an operation instruction entered by a user, and determining whether the instruction is an instruction for sliding a mobile phone. When it is detected that the operation instruction entered by the user is the instruction for sliding a mobile phone, a screen transitions from an unlock pattern to an image (usually a home screen) that is currently displayed on the screen. In addition, in a process of sliding by using a finger, the unlock pattern gradually becomes blurred. Details are shown in FIG. 10 (*a*) to FIG. 10 (*d*), and the image that is currently displayed on the screen gradually becomes clear from a blurred state. Details are shown in FIG. 10 (*e*) and FIG. 10 (*f*). The finger slides in a position marked with a number 2 in FIG. 10 (*a*) to FIG. 10 (*c*). In a process from FIG. 10 (*a*) to FIG. 10 (*e*), as the finger slides, a lock screen pattern gradually becomes blurred, and a spot image is gradually displayed on the blurred image. As the image gradually disappears, the spot image also gradually becomes blurred and even disappears. In FIG. 10 (*a*) to FIG. 10 (*f*), a number 1 represents the image, and a value 3 represents software such as a camera on the home screen. That is, FIG. 10 (*d*) to FIG. 10 (*f*) indicate a process in which the home screen gradually becomes clear from a blurred state. A number 4 represents the spot image. A process of generating a spot image and displaying the spot image on the lock screen image is the same as the foregoing described steps of the method for generating a spot image and displaying the spot image. Details are not described herein again. An only difference is that the process of displaying the spot image is completed in the process of sliding to unlock, and the spot image is not generated and displayed within a preset period of time.

According to the image processing method provided in Embodiment 1 of the present disclosure, the spot image fused with is jointly determined according to the color of the blurred image and the shape, the material, and the like of the spot image, and the size of the spot image is also closely related to the diagonal line of the image and a diagonal line of a screen of a terminal device. Therefore, a designed spot image is closer to a spot image in a physical and real world and is more real. The source image may be an image in any form, and is no longer monotonous, so that a user's visual experience is enriched.

Figure 11:
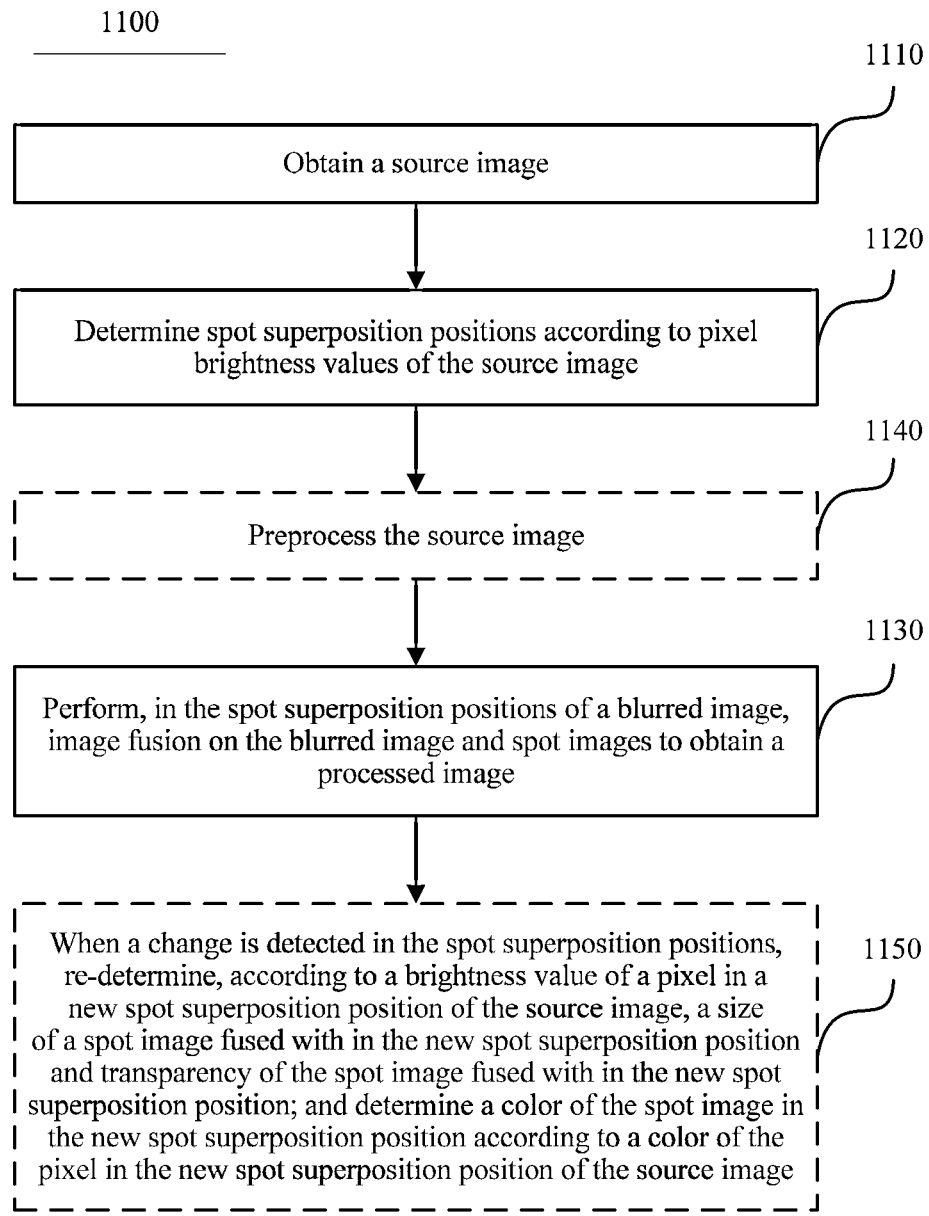
FIG. 11 is a schematic flowchart of another image processing method according to Embodiment 2 of the present disclosure.

Embodiment 2 of the present disclosure further provides another image processing method. Step 1110 and step 1120 in the method are the same as or similar to steps 310 and 320 in the image processing method provided in Embodiment 1, and steps 1130 and 1140 are the same as or similar to steps 340 and 350 in the image processing method provided in Embodiment 1. An only difference is that step 330 of blurring the source image in the foregoing method is not required. Therefore, a specific implementation is not described herein again. FIG. 11 shows a specific schematic flowchart of the method.

Preferably, after step 1130, a user may move the spot superposition positions according to the user's preference. Therefore, the method may further include step 1150: When a change in the spot superposition positions is detected, re-determine, according to a brightness value of a pixel in a new spot superposition position of the source image, a size of a spot image fused with in the new spot superposition position and transparency of the spot image fused with in the new spot superposition position; and determine a color of the spot image in the new spot superposition position according to a color of the pixel in the new spot superposition position of the source image.

The user may change a spot superposition position according to the user's preference after a spot image is fused with in a photo position, In this case, a terminal device detects that the spot image has moved, that is, detects that the spot superposition position changes. Therefore, a size, a color, transparency, and the like of the spot image fused with in a current spot superposition position need to be determined according to a series of parameters such as a brightness value, a color, transparency, and the like of a pixel in a position in which the current spot image is located on the source image. A specific calculation method is similar to the method for determining a size, a color, and transparency of a spot image in Embodiment 1. Details are not described herein again.

Figure 12:
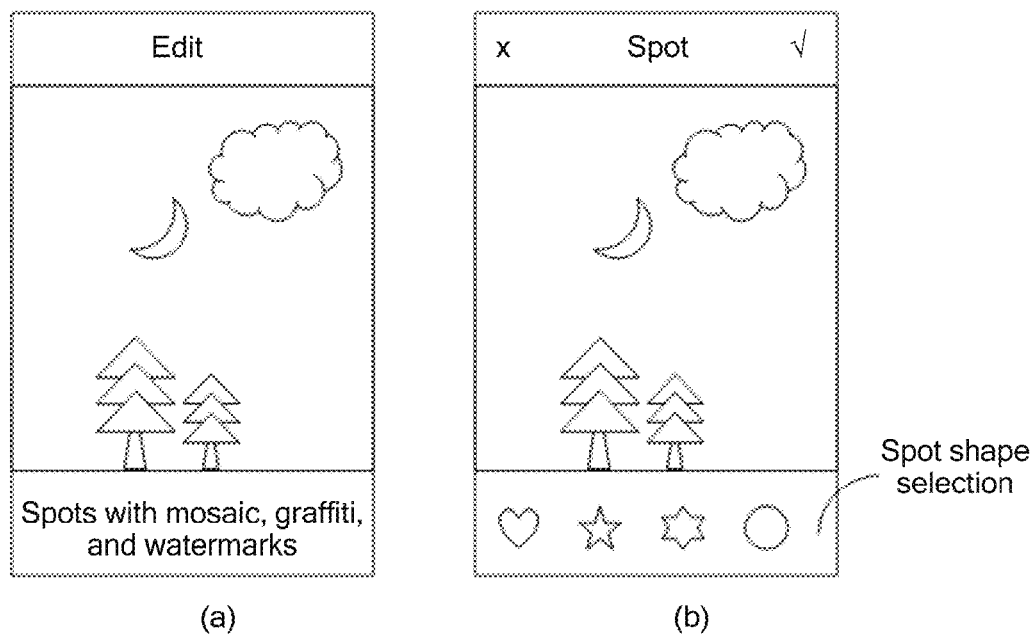
FIG. 12 is a schematic structural diagram of a spot image selection interface provided for a user.

In a specific embodiment, for example, a photo such as a photo of a night scene is shot in a photographing mode of a mobile phone. After the user pressed a photographing button, the mobile phone generates a photo. The photo may be used as the source image. The image is processed correspondingly by using step 1110 to step 1130, and the spot images are fused with in the determined spot superposition positions of the source image. In addition, in step 1130, when a shape of a spot image is determined, a processing system automatically sets the spot image to a specific shape, or the user may autonomously select a shape for the spot image. That is, the system provides a spot image shape selection interface for the user. Details are shown in FIG. 12 (*a*). The interface may further include an option used for the user to choose to perform another action, for example, may perform mosaic processing, graffiti, or watermarking on the image. After the user selects a spot image option, as shown in FIG. 12 (*b*), a page is mixed with shape selection for a spot image, so that the user autonomously selects the shape of the spot image.

Figure 13:
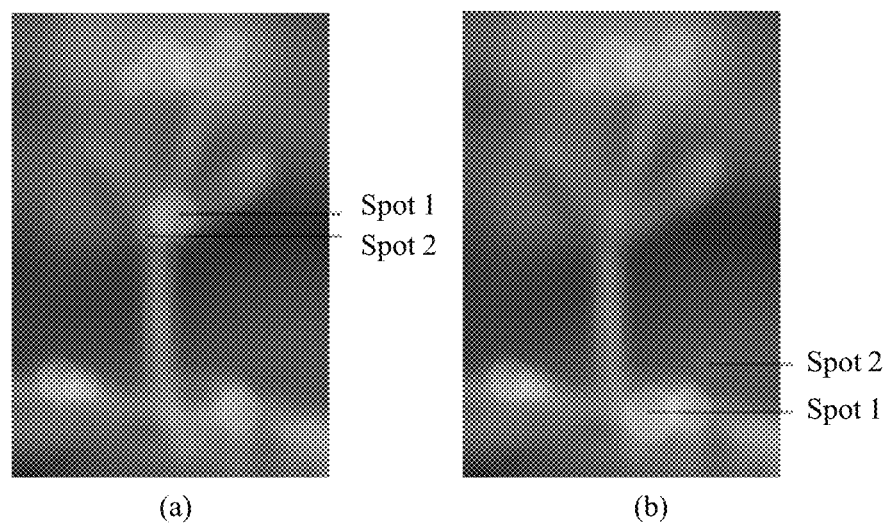
FIG. 13 is a schematic diagram of a change in a size, transparency, and a color of a spot image of an image after the spot image is shifted to another position.

Further, optionally, the user may move a position of the spot image according to a personal preference, that is, the spot image is fused with in any position of the image. In a process of moving the spot image, a calculation may be further performed according to a series of parameters such as a color, a brightness value, and transparency of a pixel, of a photo, in a new position to which the spot image is moved on the photo, and spot images of different colors, different sizes, and different transparency are obtained according to a preset rule. For example, when a brightness value of the spot image in a position in which the image is located before movement is a, and a brightness value of the image moved to a new position is b and is smaller (b<a, that is, the brightness value in the new position is smaller), a transparency value of the spot image is decreased, and/or the size of the spot image is reduced (the transparency and the size changes within a preset range). Otherwise, if a brightness value of the spot image in a position in which the image is located before movement is smaller and a brightness value of the image in the position after movement is larger, a transparency value of the spot image is increased, and the spot image is enlarged. When the spot image is moved to places of different colors in the image, the color of the spot image also changes accordingly. FIG. 13 (a) and FIG. 13 (b) separately display a size, transparency, a color, and the like of a spot image of an image after the spot image is shifted to another position.

According to the image processing method provided in Embodiment 2 of the present disclosure, the spot image fused with is jointly determined according to a color of the source image and the shape, the material effect, and the like of the spot image, and the size of the spot image is also closely related to the diagonal line of the image and resolution of a screen of a terminal device. Therefore, a designed spot image is closer to a spot image in a physical and real world and is more real. The source image may be an image in any form, and is no longer monotonous, so that a user's visual experience is enriched.

Figure 14:
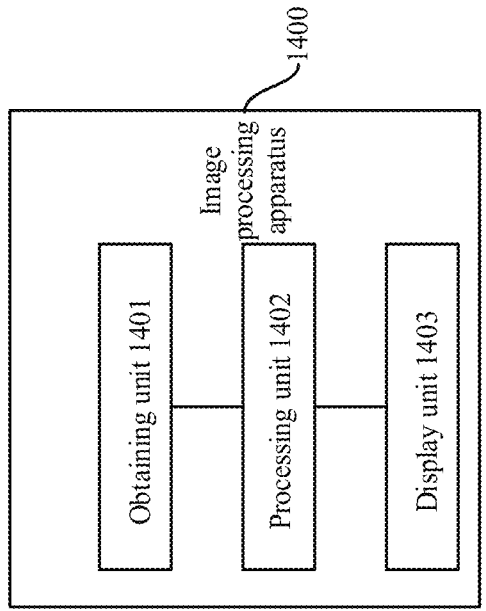
FIG. 14 is a schematic structural diagram of an image processing apparatus according to an embodiment of the present disclosure.

Corresponding to the image processing method provided in Embodiment 1, Embodiment 3 of the present disclosure further provides an image processing apparatus 1400. Details are shown in FIG. 14. The apparatus includes an obtaining unit 1401 and a processing unit 1402.

The obtaining unit 1401 is configured to obtain a source image.

The processing unit 1402 is configured to: determine spot superposition positions according to pixel brightness values of the source image, where brightness values of pixels of the source image that are located in the spot superposition positions are greater than a preset first threshold; blur the source image; and perform, in the spot superposition positions of a blurred image, image fusion on the blurred image and spot images to obtain a processed image, where the spot superposition positions and the spot images fused with in the spot superposition positions are in a one-to-one correspondence.

The processing unit 1402 is configured to: divide the source image into at least two areas; determine a mean value of pixel brightness values of each area according to the pixel brightness values of each of the at least two areas; use, as candidate spot superposition positions, pixel positions in an area in which a mean value of pixel brightness values is greater than the first threshold; and select, as the spot superposition positions, all or some of the candidate spot superposition positions according to a preset condition, where a brightness value of a pixel that is of the source image and is located in the candidate spot superposition positions is greater than the first threshold.

After the processing unit 1402 divides the source image into multiple areas, not all areas are used for displaying a spot, and instead, some areas may be selected as the candidate spot superposition positions. In addition, the candidate spot superposition positions must be areas in which a mean value of pixel brightness values is greater than the first threshold. However, to more precisely determine the spot superposition positions, areas that meet the preset condition need to be selected as final spot superposition positions from candidate areas.

First, weight values of bright spot pixels in pixels located in the candidate spot superposition positions need to be calculated. The bright spot pixels are pixels whose brightness values are greater than the first threshold, and the weight value is used to indicate density of pixels whose brightness values are greater than the first threshold in an area in which the bright spot pixels are located. Positions of pixels whose weight values are greater than a preset second threshold in the bright spot pixels are used as the spot superposition positions.

Although the processing unit 1402 has precisely determined a spot superposition position, whether a spot image is to be displayed in the position is not determined. To prevent spot images from being displayed too densely, the processing unit 1402 is further configured to specify a criterion about whether to display spot images in two spot superposition positions. The criterion includes:

Whether an overlapping part exists between spot images to be fused with in two of the spot superposition positions is determined. When an overlapping part exists between the spot images to be fused with in the two positions, image fusion is performed, in one of the two positions, on the blurred image and one of the spot images. When no overlapping part exists between the spot images to be fused with in the two positions, image fusion is separately performed, in the two positions, on the blurred image and one of the spot images.

Alternatively, a distance between two of the spot superposition positions and a sum of sizes of spot images to be fused with in the two positions are calculated. When the distance between the two positions is less than the sum of the sizes of the spot images to be fused with in the two positions, image fusion is performed, in one of the two positions, on the blurred image and one of the spot images. The spot images to be fused with in the two positions are in a shape of a circle or a regular polygon. When the spot images to be fused with in the two positions are in a shape of a circle, the sizes of the spot images to be fused with in the two positions each are a radius of the spot images to be fused with in the two positions; when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions. When the distance between the two positions is greater than or equal to the sum of the sizes of the spot images to be fused with in the two positions, image fusion is separately performed, in the two positions, on the blurred image and one of the spot images.

In addition, before performing, in the spot superposition positions of the blurred image, image fusion on the blurred image and the spot images, the processing unit 1402 is further configured to determine at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions. The shapes of the spot images fused with in the spot superposition positions may include at least one of a circle, a heart shape, an irregular circle, a polygon, or a multi-angle shape. Materials of the spot images may have textures, for example, have randomly distributed noises similar to dust, water, scratches, or smudges. Certainly, the textures may be in another form, and this is not limited herein.

When the processing unit 1402 determines the sizes of the spot images fused with in the spot superposition positions, the following steps may be included: First, a size a of a spot image fused with a prestored reference image may be set according to a designer's experience and stored in a memory of a terminal device.

Then, a first ratio r of a length b of a diagonal line of the prestored reference image to a diagonal line c of a screen of the terminal device is calculated, and a second ratio r' of a length b' of a diagonal line of the source image to the diagonal line C of the screen of the terminal device is calculated. Finally, the sizes of the spot images fused with in the spot superposition positions are determined according to the size a of the spot image fused with the prestored reference image and a ratio of the first ratio r to the second ratio. The length of the diagonal line of the reference image and the length of the diagonal line of the screen of the terminal device are both expressed by a pixel quantity. It is assumed that a resolution of the screen of the terminal device is 1080×1920p. figure formed by 1080×1920 pixels may be deemed as a rectangle. A length of a diagonal line of the rectangle is approximate to the length of the diagonal line of the screen of the terminal device.

A specific calculation of the sizes of the spot images fused with in the spot superposition positions may be expressed by the following formula:

$$a' = a \times \frac{r'}{r} \quad (14\text{-}1)$$

where a' is the sizes of the spot images fused with in the spot superposition positions, a is the size of the spot image fused with the specified reference image, r is the first ratio, and r' is the second ratio.

The determining the colors of the spot images fused with in the spot superposition positions may comprises, the processing unit 1402 may use colors of pixels in the spot superposition positions of the blurred image as the pixel colors of the spot images fused with in the spot superposition positions.

A specific method for using the processing unit 1402 to determine the materials of the spot images, the shapes of the spot images, the sizes of the spot images, and the colors and the transparency of the spot images has been described in detail in Embodiment 1. For a detailed method, refer to the description in Embodiment 1. Details are not described herein again.

In different application scenarios, the apparatus further includes a display unit 1403. For example, when the source image is a wallpaper photo on an unlocked screen of the terminal device, and the screen of the terminal device is searched for an application, the display unit 1403 is further configured to display the source image on the unlocked screen. The display unit 1403 is further configured to display the processed image on the unlocked screen when a search bar of search software pops up on the unlocked screen of the terminal device. Alternatively, when the source image is an image on a lock screen of the terminal device, the display unit 1403 is configured to display the source image on the lock screen. The display unit 1403 is further configured to display the processed image on the lock screen when caller identification display is detected on the terminal device.

Alternatively, when the source image is an image on a lock screen of the terminal device, the display unit 1403 is configured to display the source image on the lock screen. The display unit 1403 is further configured to display the processed image on the lock screen when an unlocking operation is detected on the terminal device.

When the image processing apparatus provided in Embodiment 3 of this application runs, the method provided in Embodiment 1 of this application is performed. For operating details of the image processing apparatus, refer to the method provided in Embodiment 1 of this application.

According to the image processing apparatus provided in Embodiment 3 of the present disclosure, the processing unit is used to implement the image processing method described in Embodiment 1. The spot image fused with is jointly determined according to a color of a blurred image and the shape, the material effect, and the like of the spot image, and the size of the spot image is also closely related to the length of the diagonal line of the image and a length of a diagonal line of a screen of a terminal device. Therefore, a designed spot image is closer to a spot image in a physical and real world and is more real. The source image may be an image in any form, and is no longer monotonous, so that a user's visual experience is enriched.

Figure 15:
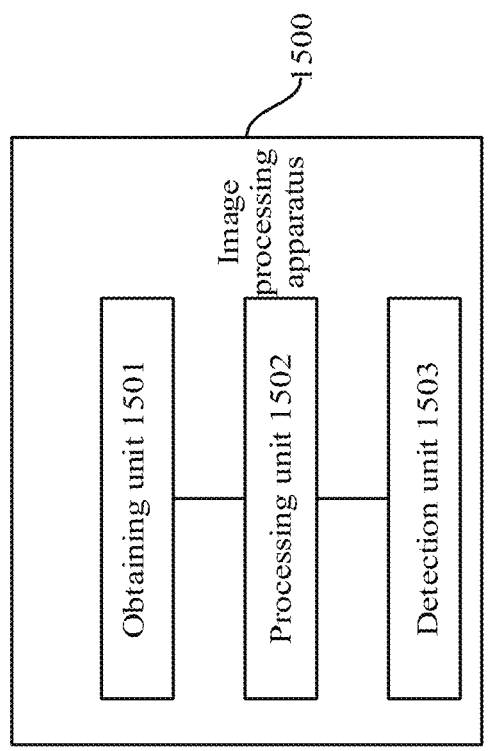
FIG. 15 is a schematic structural diagram of another image processing apparatus according to an embodiment of the present disclosure.
Figure 16:
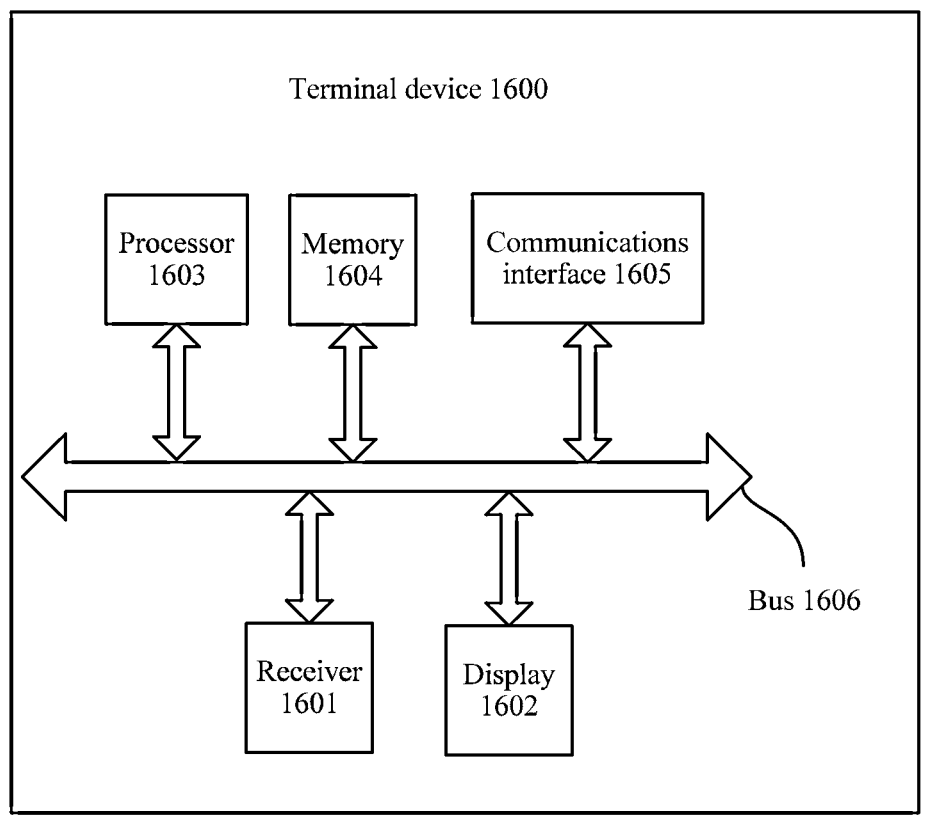
FIG. 16 is a schematic structural diagram of a terminal device according to an embodiment of the present disclosure.

Corresponding to the another image processing method provided in Embodiment 2, Embodiment 4 of the present disclosure further provides another image processing apparatus 1500. Details are shown in FIG. 15. The apparatus includes an obtaining unit 1501 and a processing unit 1502.

The obtaining unit 1501 is configured to obtain a source image.

The processing unit 1502 is configured to: determine spot superposition positions according to pixel brightness values of the source image, where brightness values of pixels of the source image that are located in the spot superposition positions are greater than a preset first threshold; and perform, in the spot superposition positions of the source image, fusion with spot images to obtain a processed image, where the spot superposition positions and the spot images fused with in the spot superposition positions are in a one-to-one correspondence.

The processing unit 1502 divides the source image into at least two areas, and determines a mean value of pixel brightness values of each area according to the pixel brightness values of each of the at least two areas.

Pixel positions in an area in which a mean value of pixel brightness values is greater than the first threshold are used as candidate spot superposition positions, and all or some of the candidate spot superposition positions are selected as the spot superposition positions according to a preset condition. A brightness value of a pixel that is of the source image and is located in the candidate spot superposition positions is greater than the first threshold. A quantity of candidate spot superposition positions is greater than or equal to a third threshold and less than or equal to a fourth threshold.

After the source image is divided into multiple areas, not all areas are used for displaying a spot, and instead, some areas may be selected as the candidate spot superposition positions. In addition, the candidate spot superposition positions must be areas in which a mean value of pixel brightness values is greater than the first threshold. However, to more precisely determine the spot superposition positions, the processing unit 1502 needs to select, as final spot superposition positions from candidate areas, areas that meet the preset condition.

A specific process of selecting, as final spot superposition positions from candidate areas, areas that meet the preset condition is as follows.

Weight values of bright spot pixels in pixels located in the candidate spot superposition positions are calculated. The bright spot pixels are pixels whose brightness values are greater than the first threshold, and the weight value is used to indicate density of pixels whose brightness values are greater than the first threshold in an area in which the bright spot pixels are located. Positions of pixels whose weight values are greater than a preset second threshold in the bright spot pixels are used as the spot superposition positions.

After the spot superposition positions are determined, the processing unit 1502 is further configured to determine whether an overlapping part exists between spot images to be fused with in two of the spot superposition positions; and when an overlapping part exists between the spot images to be fused with in the two positions, perform, in one of the two positions, image fusion on the source image and one of the spot images; or when no overlapping part exists between the spot images to be fused with in the two positions, separately perform, in the two positions, image fusion on the source image and one of the spot images; or calculate a distance between two of the spot superposition positions and a sum of sizes of spot images to be fused with in the two positions; and when the distance between the two positions is less than the sum of the sizes of the spot images to be fused with in the two positions, perform, in one of the two positions, image fusion on the source image and one of the spot images, where the spots to be superimposed on in the two positions are in a shape of a circle or a regular polygon; when the spot images to be fused with in the two positions are in a shape of a circle, the sizes of the spots to be fused with in the two positions each are a radius of the spots to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately perform, in the two positions, image fusion on the source image and one of the spot images.

Before the spot images are fused with in the spot superposition positions of the source image, the processing unit 1502 is further configured to determine at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

The shapes of the spot images fused with in the spot superposition positions may include at least one of a circle, a heart shape, an irregular circle, a polygon, or a multi-angle shape. Materials of the spot images fused with in the spot superposition positions may have textures, for example, have randomly distributed noises similar to dust, water, scratches, or smudges. Certainly, the textures may be in another form, and this is not limited herein.

When the processing unit 1502 determines the sizes of the spot images fused with in the spot superposition positions, the following steps may be included: First, a size a of a spot image fused with a prestored reference image may be set according to a designer's experience and stored in a memory of a terminal device.

Then, a first ratio r of a length b of a diagonal line of the prestored reference image to a diagonal line c of a screen of the terminal device is calculated, and a second ratio r' of a length b' of a diagonal line of the source image to the diagonal line c' of the screen of the terminal device is calculated. Finally, the sizes of the spot images fused with in the spot superposition positions are determined according to the size a of the spot image fused with the prestored reference image and a ratio of the first ratio r to the second ratio. The length of the diagonal line of the reference image and the length of the diagonal line of the screen of the terminal device are both expressed by a pixel quantity. It is assumed that a resolution of the screen of the terminal device is 1080×1920p. A figure formed by 1080×1920 pixels may be deemed as a rectangle. A length of a diagonal line of the rectangle is approximate to the length of the diagonal line of the screen of the terminal device.

A specific calculation of the sizes of the spot images fused with in the spot superposition positions may be expressed by the following formula:

$$a' = a \times \frac{r'}{r} \qquad (15\text{-}1)$$

where a' is the sizes of the spot images fused with in the spot superposition positions, a is the size of the spot image fused with the specified reference image, I is the first ratio, and r' is the second ratio.

In addition, when determining the colors of the spot images fused with in the spot superposition positions, the processing unit 1502 may determine, according to colors of pixels in the spot superposition positions of the source image, the colors of the spot images fused with in the spot superposition positions.

A specific method for using the processing unit 1502 to determine the materials of the spot images fused with in the spot superposition positions, the shapes of the spot images fused with in the spot superposition positions, the sizes of the spot images fused with in the spot superposition positions, the colors of the spot images fused with in the spot superposition positions, and the transparency of the spot images fused with in the spot superposition positions has been described in detail in Embodiment 2. For a detailed method, refer to the description in Embodiment 2. Details are not described herein again.

Preferably, the apparatus may further include a detection unit 1503, configured to detect whether the spot superposition positions change when a user changes positions of the spot images according to the user's preference. The processing unit 1502 is further configured to: when the detection unit 1503 detects a change in the spot superposition positions, determine, according to a brightness value of a pixel in a new spot superposition position of the source image, a size of a spot image fused with in the new spot superposition position, and transparency of the spot image fused with in the new spot superposition position; and determine, according to a color of the pixel in the new spot superposition position of the source image, a color of the spot image fused with in the new spot superposition position.

When the image processing apparatus provided in Embodiment 4 of this application runs, the method provided in Embodiment 2 of this application is performed. For operating details of the image processing apparatus, refer to the method provided in Embodiment 2 of this application.

According to the image processing apparatus provided in Embodiment 4 of the present disclosure, the processing unit is used to implement the image processing method described in Embodiment 2. The spot image fused with is jointly determined according to a color of a blurred image and the shape, the material effect, and the like of the spot image, and the size of the spot images is also closely related to the length of the diagonal line of the image and a length of a diagonal line of a screen of a terminal device. Therefore, a designed spot image is closer to a spot image in a physical and real world and is more real. The source image may be an image in any form, and is no longer monotonous, so that a user's visual experience is enriched.

Embodiment 5 of the present disclosure further provides a terminal device 1600. The terminal device 1600 may include a receiver 1601, a display 1602, a processor 1603, a memory 1604, a communications interface 1605, and a bus 1606. A communication connection may be established between the processor 1603, the memory 1604, and the communications interface 1605 of the terminal device by using the bus 1606.

The receiver 1601 is configured to receive an action instruction entered by a user.

The display 1602 is configured to display a source image, a blurred image, a processed image, or the like. Certainly, in this image processing method, the blurred image may be not displayed, but an image on which the processing method described in Embodiment 1 or Embodiment 2 has been performed is directly displayed.

The processor 1603 may be a central processing unit (CPU).

The memory 1604 may include a volatile memory, for example, a random access memory (RAM). Alternatively, the memory may include a non-volatile memory, for example, a read-only memory (ROM), a flash memory, a hard disk drive (HDD), or a solid state drive (SSD). Alternatively, the memory 1604 may include a combination that includes the foregoing types of memories.

The image processing method provided in Embodiment 1 or Embodiment 2 is performed by the processor 1603. The source image, the blurred image that has been blurred, the processed image, and the like are stored in the memory. In addition, the memory is further configured to store a program instruction or the like that is executed by the processor to implement the image processing method described in Embodiment 1 or Embodiment 2.

A person skilled in the art may be further aware that, units and algorithm steps described in the examples with reference to the embodiments disclosed in this specification can be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

Steps of methods or algorithms described with reference to the embodiments disclosed in this specification may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

In the foregoing specific implementations, the objective, technical solutions, and benefits of the present disclosure are further described in detail. It should be understood that the foregoing descriptions are merely specific implementations of the present disclosure, but are not intended to limit the protection scope of the present disclosure. Any modification, equivalent replacement, or improvement made without departing from the spirit and principle of the present disclosure should fall within the protection scope of the present disclosure.

What is claimed is:

1. An image processing method, wherein the method comprises:
   obtaining a source image;
   determining spot superposition positions according to pixel values of the source image, wherein values of pixels of the source image that are located in the spot superposition positions are greater than a preset first threshold; and
   performing, in the spot superposition positions of the source image, image fusion on the source image and spot images to obtain a processed image, wherein the spot superposition positions and the spot images fused with in the spot superposition positions are in a one-to-one correspondence.

2. The method according to claim 1, wherein the determining spot superposition positions according to pixel values of the source image comprises:
   dividing the source image into at least two areas;
   determining a mean value of pixel values of each area according to the pixel values of each of the at least two areas; and
   using, as candidate spot superposition positions, pixel positions in an area in which the mean value of pixel values is greater than the first threshold; and selecting, as the spot superposition positions, all or some of the candidate spot superposition positions according to a preset condition, wherein a value of a pixel that is of the source image and is located in the candidate spot superposition positions is greater than the first threshold.

3. The method according to claim 2, wherein the selecting, as the spot superposition positions, all or some of the candidate spot superposition positions according to a preset condition comprises:
   calculating weight values of bright spot pixels in pixels located in the candidate spot superposition positions, wherein the bright spot pixels are pixels whose values are greater than the first threshold, and the weight value is used to indicate density of pixels whose values are greater than the first threshold in an area in which the bright spot pixels are located; and
   using, as the spot superposition positions, positions of pixels whose weight values are greater than a preset second threshold in the bright spot pixels.

4. The method according to claim 1, wherein the spot superposition positions are at least two positions, and the performing, in the spot superposition positions of a source image, image fusion on the source image and spot images comprises:
   determining whether an overlapping part exists between spot images to be fused with in two of the spot superposition positions; and
   when an overlapping part exists between the spot images to be fused with in the two positions, performing, in one of the two positions, image fusion on the source image and one of the spot images; or
   when no overlapping part exists between the spot images to be fused with in the two positions, separately performing, in the two positions, image fusion on the source image and one of the spot images; or calculating a distance between two of the spot superposition positions and a sum of sizes of spot images to be fused with in the two positions; and when the distance between the two positions is less than the sum of the sizes of the spot images to be fused with in the two positions, performing, in one of the two positions, image fusion on the source image and one of the spot images, wherein the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or when the distance between the two positions is greater than or equal to the sum of the sizes of the spot images to be fused with in the two positions, separately performing, in the two positions, image fusion on the source image and one of the spot images.

5. The method according to claim 1, wherein before the performing, in the spot superposition positions of a source image, image fusion on the source image and spot images, the method further comprises:

determining at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

6. The method according to claim 5, wherein the method is performed by a terminal device; the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; and the determining sizes of the spot images fused with in the spot superposition positions comprises:

calculating a first ratio of a length of a diagonal line of a prestored reference image to a length of a diagonal line of a screen of the terminal device, wherein the length of the diagonal line of the reference image and the length of the diagonal line of the screen of the terminal device are both expressed by a pixel quantity;

calculating a second ratio of a length of a diagonal line of the source image to the length of the diagonal line of the screen of the terminal device; and determining, according to a size of a spot image fused with the prestored reference image and a ratio of the first ratio to the second ratio, the sizes of the spot images fused with in the spot superposition positions.

7. The method according to claim 6, wherein the determining, according to a size of a spot image fused with the prestored reference image and a ratio of the first ratio to the second ratio, the sizes of the spot images fused with in the spot superposition positions comprises:

determining, according to the following formula, the sizes of the spot images fused with in the spot superposition positions:

$$a' = a \times \frac{r'}{r}$$

wherein a' is the sizes of the spot images fused with in the spot superposition positions, a is the size of the spot image fused with the prestored reference image, r is the first ratio, and r' is the second ratio.

8. The method according to claim 5, wherein the determining pixel colors of the spot images comprises:

using colors of pixels in the spot superposition positions of the source image as the pixel colors of the spot images fused with in the spot superposition positions.

9. The method according to claim 5, wherein the shapes of the spot images fused with in the spot superposition positions comprise at least one of a circle, a heart shape, an irregular circle, a polygon, or a multi-angle shape.

10. The method according to claim 1, wherein the method is performed by a terminal device, the source image is a wallpaper photo on an unlocked screen of the terminal device, and when the screen of the terminal device is searched for an application, the method further comprises:

displaying the source image on the unlocked screen; and displaying the processed image on the unlocked screen when a search bar of search software pops up on the unlocked screen of the terminal device.

11. The method according to claim 1, wherein the method is performed by a terminal device, the source image is an image on a lock screen of the terminal device, and the method further comprises:

displaying the source image on the lock screen; and displaying the processed image on the lock screen when caller identification display is detected on the terminal device.

12. The method according to claim 1, wherein the method is performed by a terminal device, the source image is an image on a lock screen of the terminal device, and the method further comprises:

displaying the source image on the lock screen; and displaying the processed image on the lock screen when an unlocking operation is detected.

13. An image processing apparatus, wherein the apparatus comprises:

a processor coupled to a memory; and the memory having processor-executable instructions stored thereon;

wherein the processor-executable instructions are executed by the processor to cause the image processing apparatus to perform operations including:

obtaining a source image; and determining spot superposition positions according to pixel values of the source image, wherein values of pixels of the source image that are located in the spot superposition positions are greater than a preset first threshold; and performing, in the spot superposition positions of the source image, image fusion on the source image and spot images to obtain a processed image, wherein the spot superposition positions and the spot images fused with in the spot superposition positions are in a one-to-one correspondence.

14. The apparatus according to claim 13, wherein the operations further includes:
    dividing the source image into at least two areas;
    determining a mean value of pixel values of each area according to the pixel values of each of the at least two areas; and
    using, as candidate spot superposition positions, pixel positions in an area in which the mean value of pixel values is greater than the first threshold; and selecting, as the spot superposition positions, all or some of the candidate spot superposition positions according to a preset condition, wherein a value of a pixel that is of the source image and is located in the candidate spot superposition positions is greater than the first threshold.

15. The apparatus according to claim 14, wherein the operations further includes:
    calculating weight values of bright spot pixels in pixels located in the candidate spot superposition positions, wherein the bright spot pixels are pixels whose values are greater than the first threshold, and the weight value is used to indicate density of pixels whose values are greater than the first threshold in an area in which the bright spot pixels are located; and
    using, as the spot superposition positions, positions of pixels whose weight values are greater than a preset second threshold in the bright spot pixels.

16. The apparatus according to claim 13, wherein the operations further includes:
    determining whether an overlapping part exists between spot images to be fused with in two of the spot superposition positions; and
    when an overlapping part exists between the spot images to be fused with in the two positions, performing, in one of the two positions, image fusion on the source image and one of the spot images; or
    when no overlapping part exists between the spot images to be fused with in the two positions, separately performing, in the two positions, image fusion on the source image and one of the spot images; or
    calculating a distance between two of the spot superposition positions and a sum of sizes of spot images to be fused with in the two positions; and
    when the distance between the two positions is less than the sum of the sizes of the spot images to be fused with in the two positions, performing, in one of the two positions, image fusion on the source image and one of the spot images, wherein the spot images to be fused with in the two positions are in a shape of a circle or a regular polygon; when the spot images to be fused with in the two positions are in a shape of a circle, the sizes of the spot images to be fused with in the two positions each are a radius of the spot images to be fused with in the two positions; and when the spot images to be fused with in the two positions are in a shape of a regular polygon, the sizes of the spot images to be fused with in the two positions each are a distance from a center of the spot images to be fused with in the two positions to a vertex of the spot images to be fused with in the two positions; or
    when the distance between the two positions is greater than or equal to the sum of the sizes of the spot images to be fused with in the two positions, separately perform, in the two positions, image fusion on the source image and one of the spot images.

17. The apparatus according to claim 13, wherein the operations further includes:
    determining at least one of the following: material effects of the spot images fused with in the spot superposition positions, shapes of the spot images fused with in the spot superposition positions, sizes of the spot images fused with in the spot superposition positions, pixel colors of the spot images fused with in the spot superposition positions, or transparency of the spot images fused with in the spot superposition positions.

18. The apparatus according to claim 17, wherein the operations further includes:
    calculating a first ratio of a length of a diagonal line of a prestored reference image to a length of a diagonal line of a screen of the terminal device, wherein the length of the diagonal line of the reference image and the length of the diagonal line of the screen of the terminal device are both expressed by a pixel quantity;
    calculating a second ratio of a length of a diagonal line of the source image to the length of the diagonal line of the screen of the terminal device; and
    determining, according to a size of a spot image fused with the prestored reference image and a ratio of the first ratio to the second ratio, the sizes of the spot images fused with in the spot superposition positions.

19. The apparatus according to claim 18, wherein the operation of determining, according to a size of a spot image fused with the prestored reference image and a ratio of the first ratio to the second ratio, the sizes of the spot images fused with in the spot superposition positions comprises:
    determining, according to the following formula, the sizes of the spot images fused with in the spot superposition positions:

$$a' = a \times \frac{r'}{r}$$

wherein a' is the sizes of the spot images fused with in the spot superposition positions, a is the size of the spot image fused with the prestored reference image, r is the first ratio, and r' is the second ratio.

20. The apparatus according to claim 17, wherein the operations further includes:
    using colors of pixels in the spot superposition positions of the source image as the pixel colors of the spot images fused with in the spot superposition positions.

* * * * *